United States Patent
Chiba

(10) Patent No.: US 8,018,996 B2
(45) Date of Patent: Sep. 13, 2011

(54) ARITHMETIC DECODING APPARATUS AND METHOD

(75) Inventor: Takuma Chiba, Osaka (JP)

(73) Assignee: Panasonic Corporation, Osaka (JP)

( * ) Notice: Subject to any disclaimer, the term of this patent is extended or adjusted under 35 U.S.C. 154(b) by 420 days.

(21) Appl. No.: 12/397,777

(22) Filed: Mar. 4, 2009

(65) Prior Publication Data
US 2009/0232205 A1  Sep. 17, 2009

(30) Foreign Application Priority Data

Mar. 5, 2008 (JP) ................................ 2008-055473

(51) Int. Cl.
*H04N 7/12* (2006.01)
*H03M 7/38* (2006.01)

(52) U.S. Cl. ..................................... 375/240.02; 341/51
(58) Field of Classification Search .................. 348/400, 348/401, 402, 407, 413, 412; 375/240.01, 375/240.12, 240.13, 240.14, 240.15, 240.25, 375/240.16; 382/100, 107, 284, 247, 239; 341/50, 51, 107, 67, 65, 106
See application file for complete search history.

(56) References Cited

U.S. PATENT DOCUMENTS

| 7,088,271 B2 * | 8/2006 | Marpe et al. ................... 341/107 |
| 7,630,440 B2 * | 12/2009 | Prakasam ................ 375/240.25 |
| 2002/0114527 A1 | 8/2002 | Horie |
| 2002/0114529 A1 | 8/2002 | Horie |
| 2003/0058143 A1 * | 3/2003 | Chiba et al. ...................... 341/67 |
| 2004/0266329 A1 * | 12/2004 | Prakasam ..................... 717/141 |
| 2009/0089549 A1 * | 4/2009 | Liu et al. ........................ 712/208 |
| 2009/0096643 A1 * | 4/2009 | Chang ............................. 341/51 |

FOREIGN PATENT DOCUMENTS

| JP | 2001-189661 A | 7/2001 |
| JP | 2002-033925 A | 1/2002 |

OTHER PUBLICATIONS

English language Abstract of JP 2001-189661 A, Jul. 10, 2001.
English language Abstract of JP 2002-033925 A, Jan. 31, 2002.

* cited by examiner

*Primary Examiner* — Behrooz Senfi
(74) *Attorney, Agent, or Firm* — Greenblum & Bernstein, P.L.C.

(57) ABSTRACT

The decoding apparatus enabling high-speed arithmetic decoding in decoding data coded using CABAC is an arithmetic decoding apparatus which receives, as input, coded data obtained by converting multivalue information of syntax into binary data then performing Context-based Adaptive Binary Arithmetic Coding on the binary data, and which decodes the coded data into the original multivalue information. During the reconstruction of the current binary data, the arithmetic decoding apparatus, parallelly calculates, in the same cycle, "next-next identifier code" candidates and "context index" candidates corresponding to the "next-next identifier code" candidates, and, in the next cycle, parallelly calculates, in the same cycle, a "next identifier code", context index candidates corresponding to the next identifier code, and "probability variable" candidates corresponding to the "context index" candidates, and, when the current binary data reconstruction result is known, selects the respective calculation results according to the reconstruction result.

20 Claims, 13 Drawing Sheets

FIG. 2

| Cycle | Tj | Tj+1 | Tj+2 | Tj+3 | Tj+4 | Tj+5 | Tj+6 | Tj+7 |
|---|---|---|---|---|---|---|---|---|
| identifier code00_i+2 | Sj+2_0 | Sj+3_0 | Sj+4_0 | Sj+5_0 |  | Sj+6_0 | Sj+7_0 | Sj+8_0 | Sj+9_0 |
| identifier code01_i+2 | Sj+2_1 | Sj+3_1 | Sj+4_1 | Sj+5_1 | Sj+6_1 | Sj+7_1 | Sj+8_1 | Sj+9_1 |
| identifier code10_i+2 | Sj+2_2 | Sj+3_2 | Sj+4_2 | Sj+5_2 | Sj+6_2 | Sj+7_2 | Sj+8_2 | Sj+9_2 |
| identifier code11_i+2 | Sj+2_3 | Sj+3_3 | Sj+4_3 | Sj+5_3 | Sj+6_3 | Sj+7_3 | Sj+8_3 | Sj+9_3 |
| identifier code0_i+1 | Sj+1_0 | Sj+2_0 | Sj+3_2 | Sj+4_2 | Sj+5_2 | Sj+6_0 | Sj+7_0 | Sj+8_2 |
| identifier code1_i+1 | Sj+1_1 | Sj+2_1 | Sj+3_3 | Sj+4_3 | Sj+5_3 | Sj+6_1 | Sj+7_1 | Sj+8_3 |
| ctxIdx0_i+1 | Cj+1_0 | Cj+2_0 | Cj+3_2 | Cj+4_2 | Cj+5_2 | Cj+6_0 | Cj+7_0 | Cj+8_2 |
| ctxIdx1_i+1 | Cj+1_1 | Cj+2_1 | Cj+3_3 | Cj+4_3 | Cj+5_3 | Cj+6_1 | Cj+7_1 | Cj+8_3 |
| identifier code_i | Sj | Sj+1_0 | Sj+2_1 | Sj+3_3 | Sj+4_3 | Sj+5_2 | Sj+6_0 | Sj+7_1 |
| ctxIdx_i | Cj | Cj+1_0 | Cj+2_1 | Cj+3_3 | Cj+4_3 | Cj+5_2 | Cj+6_0 | Cj+7_1 |
| probability variable_i | Kj | Kj+1_0 | Kj+2_1 | Kj+3_3 | Kj+4_3 | Kj+5_2 | Kj+6_0 | Kj+7_1 |
| Binary data (binVal) | 0 | 1 | 1 | 1 | 0 | 0 | 1 | 0 |

Select using value of binary data

ARITHMETIC DECODING APPARATUS AND METHOD

BACKGROUND OF THE INVENTION (1) Field of the Invention

The present invention relates to arithmetic decoding apparatuses and methods, and particularly to an arithmetic decoding apparatus and method for decoding coded data with regard to H.264/AVC video.

(2) Description of the Related Art

Along with the development of digital technology, technology for coding image information is also evolving and developing. With this, the data amount for image information, particularly video information, also becomes extremely large. As such, when coded data of digital images is broadcast or transferred using media such as a Digital Versatile Disc (DVD), the transfer amount becomes extremely large. In particular, the data amount for hi-vision broadcasts and the like, which have recently come into practical use, assumes a size that is 6 times that of the data amount for conventional Standard Definition (SD) images.

Along with the development of digital image technology, technology for compressing data in order to process the increasing data amount is developing. Such development is being realized through compression technology which takes advantage of the attributes of image data. Furthermore, along with the enhancement of the information processing performance of computers, complex arithmetic operations required by compression technology has become possible and the compression ratio for image data is improving significantly. For example, there is the compression technique called MPEG-2 which is adopted by satellite digital hi-vision broadcasts or terrestrial digital hi-vision broadcasts. With MPEG-2, image data of a satellite digital hi-vision broadcast can be compressed to approximately 1/30th of the original size.

AVC/H.264 (H.264/AVC) has been standardized as the next image compression technique following MPEG-2. AVC/H.264 is a standard which realizes a compression ratio that is approximately twice that of MPEG-2. AVC/H.264 realizes a high compression ratio by implementing and combining a number of compression techniques. Consequently, the amount of arithmetic operations required by compression techniques such as AVC/H.264 also increases significantly.

As one compression technique implemented in AVC/H.264, there is entropy coding (variable-length coding). The two methods, CAVLC and CABAC, are provided as entropy coding methods. CAVLC stands for Context Adaptive Variable Length Coding, and is a method of coding in which, in the coding of a DCT coefficient, the run and the level, which are lengths of successive 0s, are coded starting from the direction opposite the scanning direction, using a variable length coding table.

CABAC stands for Context-based Adaptive Binary Arithmetic Coding and is a method of coding in which the appearance frequency of a coding target which varies with time is changed.

Furthermore, CABAC is a method generally referred to as arithmetic coding. In CABAC, in addition to ordinary arithmetic coding, a context index (hereafter denoted as ctxIdx) is assigned to each code to be compressed, and changes to, and management of, the appearance frequency is performed for each of the ctxIdx.

In CABAC, coding is mainly divided into two processes. The first process is called binarization and is for converting, into binary data, multivalue information to be coded that is called a syntax element. The second process is a process for performing arithmetic coding by calculating a context index (ctxIdx) with respect to the binary data obtained in the binarization.

Here, the binary data in arithmetic coding is classified according to syntax element or neighboring macroblock information, and the context index refers to the identification number assigned to each classification.

The process for decoding data coded using CABAC (hereafter denoted as "coded data") is mainly divided into two processes in the same manner as in the above-described coding. These are: a process of performing arithmetic decoding on coded data and outputting binary data; and a process of multivaluation in which the binary data is converted into a syntax element.

Arithmetic decoding is performed according to the procedure below.

1. Syntax element and binIdx are inputted to the decoding circuit (unit). In the arithmetic decoding, 1-bit binary data (binVal) corresponding to the inputted syntax element and binIdx is outputted in one process. Here, binVal is a value of binary data, and binIdx is information specifying the location of binary data in a sequence of binary data making up multivalue information.

2. A context index is calculated by performing an arithmetic operation using the syntax element, the binIdx, and neighboring macroblock information.

3. A probability variable table is accessed using the calculated context index, and pStateIdx, which is an occurrence probability currently assigned to the context index, and valMPS, which is information representing a high occurrence probability symbol, are read.

Here, the valMPS is a value of the Most Probable Symbol (MPS), that is, a value of a symbol having the highest occurrence probability. Furthermore, the pStateIdx is the number of the table having the occurrence probability of the MPS, from which the corresponding MPS occurrence probability can be obtained.

4. An arithmetic operation is performed with the pStateIdx and the valMPS as input, together with codIRange and codIOffset which are interval information used in arithmetic coding, and 1 bit of binary data is outputted.

5. The codIRange and the codIOffset are updated.

6. The occurrence probability pStateIdx and valMPS are updated, and the value of the occurrence variable table is updated.

7. The values of the next syntax element and binIdx are determined. The values of the next syntax element and binIdx is calculated using the decoded binVal (binary data), and the decoding process is completed. The syntax element and binIdx calculated here become the inputs in the decoding of the next binVal.

However, the above-described procedure for arithmetic decoding requires a long processing time, and there is the problem that high-speed arithmetic decoding is not possible.

In the arithmetic decoding procedure, much processing time is mainly required in the following 4 processes. These are specifically: 1) calculating the context index; 2) reading the pStatIdx/valMPS from the probability variable table; 3) calculating the binVal (binary data) using the codIRange and codIOffset; and 4) calculating the next syntax element and binIdx.

In addition, in order to output the 1-bit binVal, it is necessary to perform the above-mentioned 4 processes 1) to 4). Furthermore, all these 4 processes cannot be executed unless the immediately preceding process is completed.

One method for solving such problem is disclosed in Japanese Unexamined Patent Application Publication No. 2001-

189661 (Patent Reference 1). In the decoding apparatus in the aforementioned Patent Reference 1, processing is performed in advance for each of an immediately subsequent symbol, a 2nd subsequent symbol, and a 3rd subsequent symbol, and information corresponding to each situation that can actually be obtained is outputted in parallel. Subsequently, a selector is controlled and one of the parallelly outputted information is selected using the actual decoding result.

The decoding apparatus in the aforementioned Patent Reference 1 generates 4 contexts using a context generator and reads the values corresponding to the contexts from 4 context RAMs.

Furthermore, the problem of a hazard occurring in a pipeline following the updating of the probability variable is handled by providing the LPS and MPS of probability variables for the case where the contexts are the same. With this, high-speed arithmetic decoding is realized.

However, in the decoding apparatus in the aforementioned Patent Reference 1, the syntax element covered by CABAC is not defined, and thus CABAC is not taken into consideration. As such, high-speed arithmetic decoding using CABAC is not realized.

SUMMARY OF THE INVENTION

The present invention is conceived in view of the aforementioned problem and has as an object to provide a decoding apparatus and method for enabling high-speed arithmetic decoding in the decoding of data which is coded using CABAC.

In order to achieve the aforementioned object, the decoding apparatus according to the present invention is an arithmetic decoding apparatus which decodes coded data obtained by converting multivalue information of syntax into binary data and performing context-based adaptive binary arithmetic coding on the binary data, the arithmetic decoding apparatus including: a binary data decoding unit which decodes the coded data to output binary data; an identifier code calculating unit which calculates next identifier codes upon receiving input of an identifier code uniquely corresponding to a syntax element to which the binary data belongs; a context index calculating unit which calculates context indices respectively corresponding to each of the next identifier codes, from among context indices each of which is an identification number assigned, on a per classification basis, to the binary data which is classified according to the identifier code and neighboring information, the next identifier codes being calculated by the identifier code calculating unit; and a probability variable outputting unit having a probability variable table holding probability variables corresponding to the context indices, and which outputs probability variables respectively corresponding to the context indices calculated by the context index calculating unit, wherein in a process cycle in which the binary data decoding unit outputs 1-bit binary data: the binary data decoding unit executes the decoding by using one of the probability variables outputted by the probability variable outputting unit; the calculating for the next identifier codes by the identifier code calculating unit and the calculating for the context indices by the context index calculating unit are executed within the process cycle; and the outputting of the probability variables respectively corresponding to the context indices is executed within the process cycle, and a process cycle including the calculating for the next identifier codes by the identifier code calculating unit and the calculating for the context indices by the context index calculating unit, a process cycle for the outputting of the probability variables by the probability variable outputting unit, and a process cycle for the decoding by the binary data decoding unit are executed simultaneously as a three-staged pipeline According to this configuration, during the reconstruction of the current binary data, "next-next identifier code" candidates and "context index" candidates corresponding to the "next-next identifier code" candidates are calculated in parallel in the same cycle; a "next (immediately subsequent) identifier code", context index candidates corresponding to the next identifier code, and "probability variable" candidates corresponding to the "context index" candidates are calculated in parallel in the next cycle; and, at the point in time when the current binary data reconstruction result is known, the respective calculation results are selected according to the reconstruction result, and thus, three-staged pipelining is possible for the binary data and syntax reconstructing processes which could not be executed unless the immediately preceding process in the arithmetic decoding procedure is completed. With this, it is possible to realize a CABAC arithmetic decoding apparatus that enables high-speed arithmetic decoding in the decoding of data encoded according to CABAC.

At this time, the identifier code calculating unit may output the next identifier code for when the binary data corresponding to the inputted identifier code is "0" and the next identifier code for when the binary data corresponding to the inputted identifier code is "1", and the identifier code and the next identifier codes may each include binIdx which is information specifying a position of binary data in a sequence of the binary data making up the multivalue information.

Furthermore, a current identifier code corresponding to binary data being decoded in a current process cycle may be further inputted to the identifier code calculating unit.

Furthermore, the next identifier codes having 2-bit information may be inputted to the context index calculating unit, the information indicating that binary data currently being decoded is "0" and binary data to be decoded next is "0", that the binary data currently being decoded is "0" and the binary data to be decoded next is "1", that the binary data currently being decoded is "1" and the binary data to be decoded next is "0", or that the binary data currently being decoded is "1" and the binary data to be decoded next is "1".

Furthermore, an identifier code that immediately precedes the next identifier code and a current identifier code corresponding to the binary data currently being decoded may be further inputted to the context index calculating unit.

Furthermore, the identifier code calculating unit may: calculate first next identifier codes corresponding respectively to next-next binary data to be decoded in a next-next process cycle, when an identifier code corresponding to binary data "0" decoded in a current process cycle and a next binary data "0" or "1" to be decoded in the next process cycle is inputted, the binary data and the next binary data being decoded by the binary data decoding unit; further calculate second next identifier codes corresponding respectively to next-next binary data to be decoded in a next-next process cycle, when an identifier code corresponding to binary data "1" decoded in a current process cycle and a next binary data "0" or "1" to be decoded in the next process cycle is inputted, the binary data and the next binary data being decoded by the binary data decoding unit; and select either the first next identifier codes or the second identifier codes, depending on the binary data decoded and outputted in the current process cycle by the binary data decoding unit, and output the selected one of the first next identifier codes and the second identifier codes.

Furthermore, the identifier code calculating unit may: select the first next identifier codes corresponding respectively to (the binary data, the next binary data)=(0, 0) and (0, 1) and output the selected first next identifier codes as next identifier codes, when the binary data decoded and outputted in the current process cycle is "0"; and select the second next identifier codes corresponding respectively to (the binary data, the next binary data)=(1, 0) and (1, 1) and output the selected second next identifier codes as next identifier codes, when the binary data decoded and outputted in the current process cycle is "1".

Furthermore, the context index calculating unit may: calculate, in a current processing cycle and a next processing cycle, four types of context indices including: a context index corresponding to next-next binary data to be decoded after-the-next when outputting (binary data being decoded in the current process cycle, binary data to be decoded in the next processing cycle)=(0, 0); a context index corresponding to next-next binary data to be decoded after-the-next when outputting (0, 1); a context index corresponding to next-next binary data to be decoded after-the-next when outputting (1, 0); and a context index corresponding to next-next binary data to be decoded after-the-next when outputting (1, 1), and select, from among the four types of context indices, two types of context indices corresponding respectively to (0, 0) and (0, 1), or two types of context indices corresponding respectively to (1, 0) and (1, 1), depending on the binary data outputted in the current cycle by the binary data decoding unit, and output the selected two types of context indices.

Furthermore, first context indices and second context indices may be inputted to the probability variable outputting unit, the first context indices corresponding to binary data to be decoded in the next process cycle when the binary data decoding unit outputs binary data "0" in a current process cycle, and the second context indices corresponding to binary data to be decoded in the next process cycle when the binary data decoding unit outputs binary data "1" in a current process cycle, and the probability variable outputting unit may: output two types of the probability variables including first probability variables corresponding to the first context indices, and second probability variables corresponding to the second context indices; and select, from among the two types of probability variables, either the first probability variables corresponding to the binary data "0" or the second probability variables corresponding to the binary data "1", depending on the binary data outputted in the current cycle by the binary data decoding unit, and output the selected one of the first probability variables and the second probability variables.

According to this configuration, it is possible to simplify the configuration of the circuit in the decoding apparatus for the three-staged pipelining of the binary data and syntax reconstruction processes.

At this time, the binary data decoding unit may include: a decoding unit which executes the decoding to output a new probability variable corresponding to a result of the decoding and a context index corresponding to the probability variable; a probability variable register which holds the probability variable outputted by the decoding unit and the context index; a comparator which compares the context index corresponding to the probability variable outputted by the probability variable outputting unit and the context index held in the probability variable register; and a selector which selects the probability variable held in the probability variable register, out of the probability variable outputted by the probability variable outputting unit and the probability variable held in the probability register, when a result of the comparison is a match.

According to this configuration, the "probability variable" candidates corresponding to the context index candidates corresponding to the next identifier code, and the "probability variable" candidates corresponding to "context index" candidates, can be used as "probability variables" without conflict.

At this time, the probability variable register may be a first-in-first-out pipeline buffer.

According to this configuration, the pipeline of the decoding apparatus can be handled even in the case where plural process cycles are required from when the binary data decoding unit outputs the "probability variable" updated by the binary data decoding unit, to when the value of the "probability variable" updated by the binary data decoding unit is reflected in the probability variable table included in the probability variable outputting unit.

At this point, the arithmetic decoding apparatus may further include: an MVD calculating unit which calculates an identifier code indicating a next MVD vector upon receiving input of the identifier code, when a value of the identifier code indicates an MVD vector which is a motion vector in a moving picture; an MVD context index calculating unit which calculates a context index upon receiving input of the identifier code calculated by the MVD calculating unit; and a context index selecting unit which selects one of the context index calculated by the context index calculating unit and the context index calculated by the MVD context index calculating unit, depending on the value of the identifier code.

At this time, the identifier code inputted to the MVD calculating unit may be an identifier code present in the process cycle for the outputting of the probability variables by the probability variable outputting unit.

In the case where the value of an identifier code indicates an MVD vector which is a motion vector, the MVD context calculation involves a large amount of processing since there are many types of MVD and searching (associating) is complicated. As such, there are cases where the context index calculations cannot be completed within the process cycle in which the binary data decoding unit reconstructs 1-bit binary data and outputs the restored 1-bit binary data. According to this configuration, by separating and executing in parallel the context index calculations for when the value of an identifier code indicates an MVD which is a motion vector, high-speed arithmetic decoding becomes possible in the decoding of data encoded according to CABAC.

At this time, the arithmetic decoding apparatus may further include a stream supplying unit which selectively executes supplying one stream including coded data continuously or supplying plural streams intermittently, wherein the binary data decoding unit may perform the decoding on the stream supplied by the stream supplying unit.

According to this configuration, it is possible to increase the output data rate of arithmetic decoding up to the clock frequency. With this, it becomes possible to handle both the decoding of a high bit rate stream and the simultaneous decoding of plural streams of a standard bit rate (10 to 40 Mbps), and it is possible to realize a decoding apparatus including an arithmetic decoding circuit that can scalably handle various streams.

Furthermore, the decoding apparatus according to the present invention may by an arithmetic decoding apparatus which decodes coded data obtained by converting multivalue information of syntax into binary data and performing context-based adaptive binary arithmetic coding on the binary data, the arithmetic decoding apparatus including: a binary data decoding unit which decodes the coded data to output binary data; an identifier code calculating unit which calculates next identifier codes upon receiving input of an identifier code; a context index calculating unit which calculates context indices respectively corresponding to the next identifier codes, from among context indices each of which is an identification number assigned, on a per classification basis, to the binary data which is classified according to the identifier code and neighboring information, the next identifier codes being calculated by the identifier code calculating unit; a probability variable outputting unit having a probability variable table holding probability variables corresponding to the context indices, and which outputs probability variables respectively corresponding to the context indices calculated by the context index calculating unit; an MVD calculating unit which calculates an identifier code indicating a next MVD vector upon receiving input of the identifier code, when a value of the identifier code indicates an MVD vector which is a motion vector in a moving picture; an MVD context index calculating unit which calculates a context index upon receiving input of the identifier code calculated by the MVD calculating unit; and a context index selecting unit which selects one of the context index calculated by the context index calculating unit and the context index calculated by the MVD context index calculating unit, depending on the value of the identifier code, wherein, in a process cycle in which the binary data decoding unit outputs 1-bit binary data, the binary data decoding unit performs the decoding by using one of the probability variables outputted by the probability variable outputting unit.

Furthermore, the coding apparatus according to the present invention may be an H.264/AVC Context-based Adaptive Binary Arithmetic Coding (CABAC)-based arithmetic coding apparatus which performs arithmetic coding on binary data according to Context-based Adaptive Binary Arithmetic Coding, the arithmetic coding apparatus including: an identifier code sequence unit which sets an identifier code, and outputs a next identifier code upon receiving inputs of binary data to be coded and the identifier code corresponding to the binary data, the identifier code corresponding to a syntax element to which the binary data belongs and to binIdx which is information specifying a position of the binary data in a sequence of binary data making up multivalue information; a context index calculating unit which calculates a context index upon receiving input of the identifier code; a probability variable table having the calculated context index as a variable, and which outputs pStateIdx and valMPS; and an encoding unit which encodes the binary data upon receiving inputs of the pStateIdx, the valMPS, and the binary data.

Note that the present invention can be implemented, not only as an apparatus, but also as an integrated circuit including the processing units included in such an apparatus, a method having, as steps, the processing units included in such apparatus, a program which causes a computer to execute such steps, and information, data, or a signal including such program. Moreover, such program, information, data and signal may be distributed via a recording medium such as a CD-ROM or a communication network such as the Internet.

According to the present invention, it is possible to realize a decoding apparatus and a method thereof for enabling high-speed arithmetic decoding in the decoding of data encoded according to CABAC. Furthermore, by also applying, to arithmetic coding, the scheme used in the decoding apparatus and method, which makes use of the syntax element, to which a binVal belongs, and binIdx, it is possible to realize a coding apparatus and method thereof for enabling high-speed and highly-efficient arithmetic coding in the coding of image data according to CABAC. As such, the practical value of the present invention in the present age where images having a large amount of data and requiring high picture quality, such as in hi-vision broadcasts, is becoming popular is extremely high.

Further Information About Technical Background to this Application

The disclosure of Japanese Patent Application No. 2007-112416 filed on Apr. 20, 2007 and No. 2008-055473 filed on Mar. 5, 2008 each including specification, drawings and claims are incorporated herein by reference in their entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2 is a diagram showing an example of a timing chart for when the image decoding apparatus in the first embodiment of the present invention operates.

DESCRIPTION OF THE PREFERRED EMBODIMENT(S)

First Embodiment

Hereinafter, a first embodiment of the present invention shall be described with reference to the Drawings.

Figure 1:
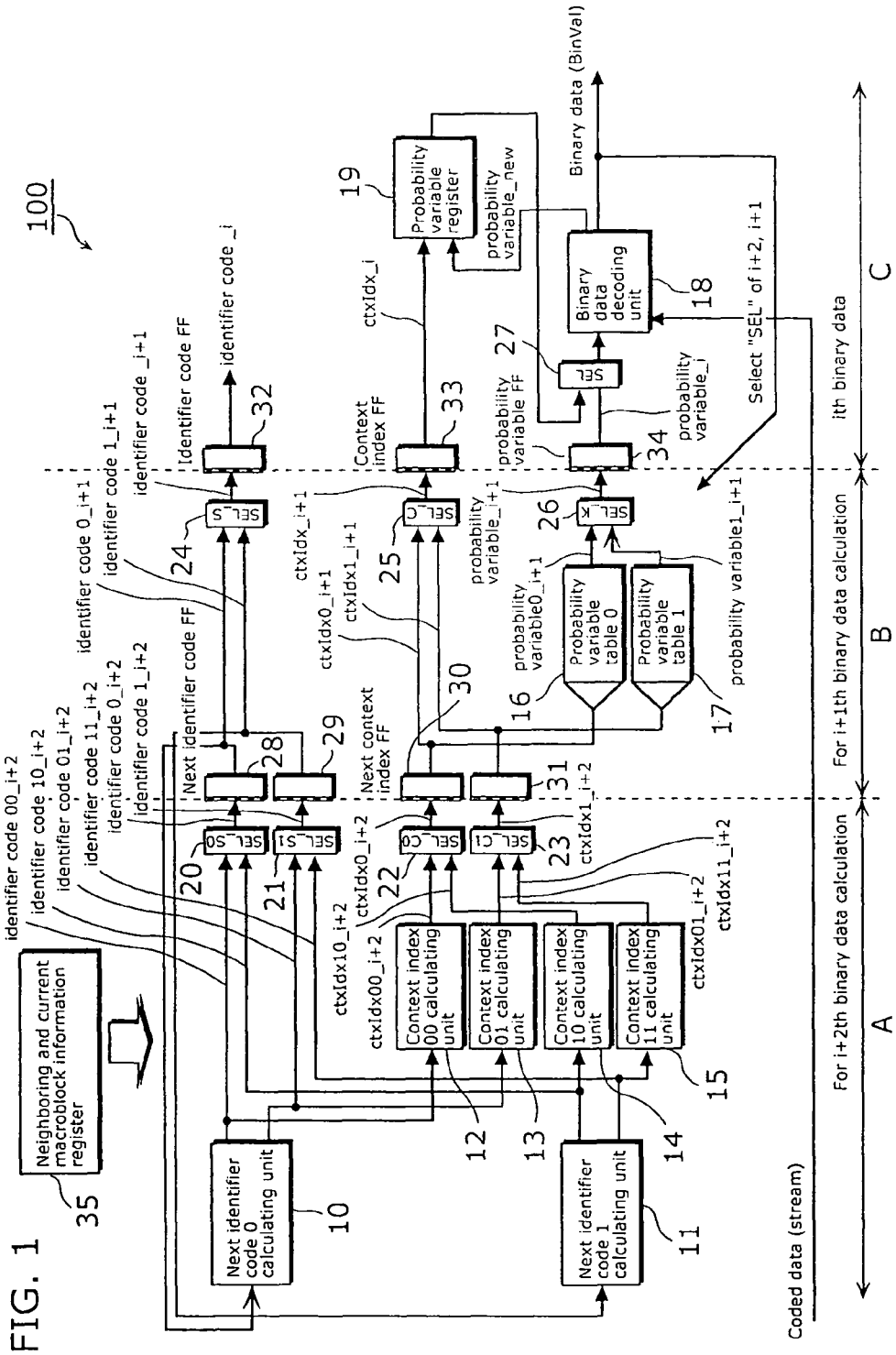
FIG. 1 is a block diagram showing the configuration of a decoding apparatus in a first embodiment of the present invention.

FIG. 1 is a block diagram showing the configuration of a decoding apparatus in the first embodiment of the present invention.

As shown in FIG. 1, a decoding apparatus 100 is an arithmetic decoding apparatus which receives, as an input, coded data obtained by converting multivalue information of syntax into binary data then performing arithmetic coding on the binary data according to Context-based Adaptive Binary Arithmetic Coding, and which decodes the coded data into the original identifier code. The decoding apparatus 100 includes a next identifier code 0 calculating unit 10, a next identifier code 1 calculating unit 11, a context index 00 calculating unit 12, a context index 01 calculating unit 13, a context index 10 calculating unit 14, a context index 11 calculating unit 15, a probability variable table 0 unit 16, a probability variable table 1 unit 17, a binary data decoding unit 18, a probability variable register 19, an SEL_S0 unit 20, an SEL_S1 unit 21, an SEL_C0 unit 22, an SEL_C1 unit 23, an SEL_S unit 24, an SEL_C unit 25, an SEL_K unit 26, an SEL unit 27, next identifier code FFs 28 and 29, next context index FFs 30 and 31, an identifier code FF 32, a context index FF 33, a probability variable FF 34, and a neighboring and current macroblock information register 35.

The next identifier code 0 calculating unit 10 and the next identifier code 1 calculating unit 11, which correspond to the identifier code calculating unit in the present invention, each calculate, in parallel with the process cycle in which the binary data decoding unit reconstructs 1-bit binary data and outputs the reconstructed 1-bit binary data, identifier codes necessary for reconstructing next-next 1-bit binary data. Specifically, having the "next identifier code" as an input, the next identifier code 0 calculating unit 10 and the next identifier code 1 calculating unit 11 calculate "next-next identifier codes". The "next-next identifier codes" calculated and outputted by the next identifier code 0 calculating unit 10 and the next identifier code 1 calculating unit 11 are identifier codes for the respective cases of when the value of the binVal (binary data to be decoded) corresponding to the "next identifier code" is 0 and when it is 1. Specifically, 4 "next-next identifier codes" are outputted. It should be noted that although the next identifier code 0 calculating unit 10 and the next identifier code 1 calculating unit 11 are given different names for the sake of convenience, they have exactly the same circuit configuration.

The context index 00 calculating unit 12, the context index 01 calculating unit 13, the context index 10 calculating unit 14, and the context index 11 calculating unit 15, which correspond to the context index calculating unit in the present invention, each calculate a context index necessary for reconstructing the next 1-bit binary data from the identifier code calculated by the identifier code calculating unit. Specifically, the context index 00 calculating unit 12, the context index 01 calculating unit 13, the context index 10 calculating unit 14, and the context index 11 calculating unit 15 receive, as input, the respective "next-next identifier codes" from the next identifier code 0 calculating unit 10 or the next identifier code 1 calculating unit 11, and calculate "next-next context indices" respectively corresponding to the inputted identifier codes. Specifically, 4 "next-next context indices" are outputted.

It should be noted that although the context index 00 calculating unit 12, the context index 01 calculating unit 13, the context index 10 calculating unit 14, and the context index 11 calculating unit 15 are given different names for the sake of convenience, they have exactly the same circuit configuration.

The SEL_C0 unit 22 and the SEL_C1 unit 23 are circuits which select 2 "next-next context indices" out of the 4 "next-next context indices" outputted by the context index 00 calculating unit 12, the context index 01 calculating unit 13, the context index 10 calculating unit 14, and the context index 11 calculating unit 15, according to the value of the binVal (binary data to be decoded) calculated in the same cycle. The selected "next-next context indices" become "next context indices" in the next cycle.

Here, cycle refers to the process cycle in which the binary data decoding unit 18 reconstructs 1-bit binary data (binVal) and outputs the reconstructed 1-bit binary data. In FIG. 1, the outputs of the next identifier code 0 calculating unit 10, the next identifier code 1 calculating unit 11, the context index 00 calculating unit 12, the context index 01 calculating unit 13, the context index 10 calculating unit 14, the context index 11 calculating unit 15, the SEL_S0 unit 20, the SEL_S1 unit 21, the SEL_C0 unit 22, and the SEL_C1 unit 23 (the configuration in the range indicated by A in FIG. 1) are processed in the same cycle. Furthermore, the outputs of the probability variable table 0 unit 16, the probability variable table 1 unit 17, the SEL_S unit 24, the SEL_C unit 25, the SEL_K unit 26, and the next identifier code FFs 28 and 29, and the outputs of the next context index FFs 30 and 31 in FIG. 1 (the configuration in the range indicated by B in FIG. 1) are processed in the same cycle. Furthermore, the outputs of the binary data decoding unit 18, the SEL unit 27, and the identifier code FF 32, the output of the context index FF 33, and the output of the probability variable FF 34 (the configuration in the range indicated by C in FIG. 1) are processed in the same cycle.

Furthermore, the cycles in the ranges in A, B, and C in FIG. 1 are executed in parallel for the same cycle time.

The next context index FFs 30 and 31 are the circuits in which the 2 "next-next context indices" selected by the SEL_C0 unit 22 and the SEL_C1 unit 23 are respectively set.

Specifically, the SEL_S0 unit 20 and the SEL_S1 unit 21 are circuits which select, according to the value of the binVal (binary data to be decoded) calculated in the same cycle, 2 "next-next identifier codes" out of the 4 "next-next identifier codes" outputted by the next identifier code 0 calculating unit 10 and the next identifier code 1 calculating unit 11. The selected "next-next identifier codes" become "next identifier codes" in the next cycle.

The next identifier code FFs 28 and 29 are circuits in which the 2 "next-next identifier codes" selected by the SEL_S0 unit 20 and the SEL_S1 unit 21 are respectively set.

The SEL_S unit 24 is a circuit which selects, according to the value of the binVal (binary data to be decoded) calculated in the same cycle, one of the two "next identifier codes" outputted by the next identifier code FFs 28 and 29. The selected "next identifier code" becomes the "identifier code" in the next cycle.

The identifier code FF 32 is a circuit in which the "next identifier code" selected by the SEL_S unit 24 is set. The identifier code FF 32 outputs the "identifier code" in the next cycle.

The probability variable table 0 unit 16 and the probability variable table 1 unit 17, which correspond to the probability variable output unit in the present invention, each include a probability variable table storing probability variables corresponding to context indices, and output, in parallel with the process cycle, a probability variable corresponding to the context index calculated by the context index calculating unit, by referring to the probability variable table. Specifically, the probability variable table 0 unit 16 and the probability variable table 1 unit 17 each include a table storing probability variables with context indices as arguments, and refer to and output a "probability variable" corresponding to a respective "next context index". Coded data is initialized at the start of the decoding process. Furthermore, when a new probability variable is calculated according to the outputting of the value of the binVal (binary data to be decoded) by the binary data decoding unit 18, such value is updated.

The SEL_K unit 26 is a circuit which selects, according to the value of the binVal (binary data to be decoded) calculated in the same cycle, one of the "probability variables" outputted from the probability variable table 0 unit 16 and the probability variable table 1 unit 17, as the "probability variable".

The probability variable FF 34 is a circuit in which the "probability variable" selected by the SEL_K unit 26 is set.

The SEL_C unit 25 is a circuit which selects, according to the value of the binVal (binary data to be decoded) calculated in the same cycle, one of the 2 "next context indices" respectively set in the next context index FFs 30 and 31. The selected "next context index" becomes the "context index" in the next cycle.

The context index FF 33 is a circuit in which the "context index" selected by the SEL_C unit 25 is set.

The binary data decoding unit 18, which corresponds to the binary data decoding unit in the present invention, reconstructs binary data and outputs the reconstructed binary data. Specifically, the binary data decoding unit 18 receives an input of the "probability variable" and outputs the value of binVal which is binary data. At the same time, the binary data decoding unit 18 updates the "probability variable" and outputs the updated "probability variable" to the probability variable register 19. In the probability variable register 19, the "context index" outputted by the context index FF 33 and the updated "probability variable" outputted by the binary data decoding unit 18 are stored as 1 set.

The SEL unit 27 selects the newest "probability variable" from the "probability variable" outputted by the probability variable FF 34 and the "probability variable" stored in the probability variable register 19. Specifically, when a context index which is the same as the "context index" outputted by the context index FF 33 is present in the probability variable register 19, the probability variable that is in a set with the context index in the probability variable register is selected by the SEL unit 27 and inputted to the binary data decoding unit 18, and the decoding process is performed.

The neighboring and current macroblock information register 35 stores, in a register, information created based on the value of binary data outputted as a result of the decoding by the binary data decoding unit 18 and an identifier code corresponding to such binary data.

The information stored in the neighboring and current macroblock information register 35 is inputted to the next identifier code 0 calculating unit 10, the next identifier code 1 calculating unit 11, the context index 00 calculating unit 12, the context index 01 calculating unit 13, the context index 10 calculating unit 14, the context index 11 calculating unit 15, and is referred to when the respective units calculate a value.

The probability variable register 19, which corresponds to the probability variable register in the present invention, holds the probability variable and context index outputted by the decoding unit. Specifically, the probability variable register 19 holds, as a set, the "context index" outputted by the context index FF 33 and the updated "probability variable" outputted by the binary data decoding unit. The probability variable register 19 stores the "probability variable" that will be overwritten in the probability variable table through the arithmetic decoding process, until it is overwritten in the probability variable table in a set with the "context index".

Next, using FIG. 1, specific description shall be made regarding the operation of the decoding apparatus 100 which receives, as an input, coded data obtained by converting multivalue information of syntax into binary data then performing arithmetic coding on the binary data according to Context-based Adaptive Binary Arithmetic Coding, and which decodes the coded data into the original syntax element.

The next identifier code 0 calculating unit 10 receives, as input, "identifier code0_i+1" which is a "next identifier code", and outputs "identifier code00_i+2" and "identifier code01_i+2" which are to be "next-next identifier codes" to the context index 00 calculating unit 12, the context index 01 calculating unit 13, the SEL_S0 unit 20, and the SEL_S1 unit 21.

The next identifier code 1 calculating unit 11 receives, as input, "identifier code1_i+1" which is a "next identifier code", and outputs "identifier code10_i+2" and "identifier code11_i+2" which are to be "next-next identifier codes" to the context index 10 calculating unit 14, the context index 11 calculating unit 15, the SEL_S0 unit 20, and the SEL_S1 unit 21.

The context index 00 calculating unit 12 receives, as input, "identifier code00_i+2" which is a "next-next identifier code", and outputs "ctxIdx00_i+2" which is to be a "next-next context index" to the SEL_C0 unit 22.

The context index 01 calculating unit 13 receives, as input, "identifier code01_i+2" which is a "next-next identifier code", and outputs "ctxIdx01_i+2" which is to be a "next-next context index" to the SEL_C1 unit 23.

The context index 10 calculating unit 14 receives, as input, "identifier code10_i+2" which is a "next-next identifier code", and outputs "ctxIdx10_i+2" which is to be a "next-next context index" to the SEL_C0 unit 22.

The context index 11 calculating unit 15 receives, as input, "identifier code11_i+2" which is a "next-next identifier code", and outputs "ctxIdx11_i+2" which is to be a "next-next context index" to the SEL_C1 unit 23.

Upon receiving inputs of "ctxIdx00_i+2" and "ctxIdx10_i+2" which are "next-next context indices", the SEL_C0 unit 22 selects "ctxIdx00_i+2" when binVal=0 and selects "ctxIdx10_i+2" when binVal=1, and outputs the result of the selection, to the next context index FF 30, as "ctxIdx0_i+2" which is to be a "next context index" in the next cycle.

Upon receiving inputs of "ctxIdx01_i+2" and "ctxIdx11_i+2" which are "next-next context indices", the SEL_C1 unit 23 selects "ctxIdx01_i+2" when binVal=0 and selects "ctxIdx11_i+2" when binVal=1, and outputs the result of the selection, to the next context index FF 31, as "ctxIdx1_i+2" which is to be a "next context index" in the next cycle.

The next context index FF 30 and the next context index FF 31 are respectively set with "ctxIdx0_i+2" and "ctxIdx1_i+2", and output these, as "ctxIdx0_i+1" and "ctxIdx1_i+1" to the SEL_C unit 25, and to the probability variable table 0 unit 16 and the probability variable table 1 unit 17.

Upon receiving inputs of "identifier code00_i+2" and "identifier code10_i+2" which are "next-next identifier codes", the SEL_S0 unit 20 selects "identifier code00_i+2" when binVal=0 and selects "identifier code10_i+2" when binVal=1, and outputs the result of the selection, to the next identifier code FF 28, as "identifier code0_i+2" which is to be a "next identifier code" in the next cycle.

Upon receiving inputs of "identifier code00_i+2" and "identifier code11_i+2" which are "next-next identifier codes", the SEL_S1 unit 21 selects "identifier code10_i+2" when binVal=0 and selects "identifier code11_i+2" when binVal=1, and outputs the result of the selection, to the next identifier code FF 29, as "identifier code1_i+2" which is to be a "next identifier code" in the next cycle.

The next identifier code FF 28 is set with "identifier code0_i+2", and outputs this, as "identifier code0_i+1", to the SEL_S unit 24 and the next identifier code 0 calculating unit 10.

The next identifier code FF 29 is set with "identifier code1_i+2", and outputs this, as "identifier code1_i+1", to the SEL_S unit 24 and the next identifier code 1 calculating unit 11.

Upon receiving inputs of "identifier code0_i+1" and "identifier code1_i+1" which are "next identifier codes", the SEL_S unit 24 selects "identifier code0_i+1" when binVal=0 and selects "identifier code1_i+1" when binVal=1, and outputs the result of the selection, to the identifier code FF 32, as "identifier code_i+1" which is to be the "identifier code" in the next cycle.

The identifier code FF 32 is set with "identifier code_i+1" and outputs this as "identifier code_i".

Using "ctxIdx0_i+1" and "ctxIdx1_0+1" which are "context indices" outputted by the next context index FF 30 and the next context index FF 31, and the probability variable tables, the probability variable table 0 unit 16 and the probability variable table 1 unit 17 refer to "probability variables" corresponding to the respective "context indices". The probability variable table 0 unit 16 outputs the "probability variable" corresponding to "ctxIdx0_i+1" as "probability variable0_i+1". The probability variable table 1 unit 17 outputs the "probability variable" corresponding to "ctxIdx1_i+1" as "probability variable1_i+1".

Furthermore, although the probability variable table 0 unit 16 and the probability variable table 1 unit 17 are given different names, the contents of their variable tables and their circuit configuration are exactly the same.

Upon receiving inputs of "probability variable0_i+1" and "probability variable1_i+1" which are "probability variables", the SEL_K unit 26 selects "probability variable0_i+1" when binVal=0 and selects "probability variable1_i+1" when binVal=1, and outputs the result of the selection as "probability variable_i+1", to the probability variable FF 34.

The probability variable FF 34 is set with "probability variable_i+1" and outputs this as "probability variable_i". In addition, the probability variable FF 34 outputs "probability variable_i" to the binary data decoding unit 18 via the SEL 27.

The SEL_C unit 25 receives, as inputs, "ctxIdx0_i+1" and "ctxIdx1_i+1", which are "next context indices", outputted by the next context index FF 30 and the next context index FF 31. The SEL_C unit 25 selects "ctxIdx0_i+1" when binVal=0 and selects "ctxIdx1_i+1" when binVal=1, and outputs the result of the selection, to the context index FF 33, as "ctxIdx_i+1" which is to be the "context index" in the next cycle.

The context index FF 33 is set with "ctxIdx_i+1" and outputs a value as "ctxIdx_i".

Upon receiving input of "probability variable_i" outputted as the probability variable by the probability variable FF 34, the binary data decoding unit 18 outputs binVal which is binary data. At the same time, the binary data decoding unit 18 outputs, to the probability variable register 19, "probability variable_new" as an updated probability variable.

The probability variable register 19 temporarily stores, as 1 set, the "context index" outputted by the context index FF 33 and "probability variable_new".

FIG. 2 is a diagram showing an example of a timing chart for when the image decoding apparatus operates. FIG. 2 shall be used to describe that, by parallelly executing the cycles in the ranges indicated by A, B, and C in FIG. 1 for the same cycle time, the process of decoding binVal and the process of calculating the next identifier code, which could not be executed unless the immediately preceding process in the arithmetic decoding procedure is completed, can be successively handled through a three-staged pipelining.

FIG. 2 shows a process that goes through from cycle Tj up to cycle Tj+7. For example, in cycle Tj+3, the "next identifier code 0 calculating unit 10" receives, as input, "identifier code0_i+1"="Sj+4_2" which is a "next identifier code" and outputs "identifier code00_i+2"="Sj+5_0" and "identifier code01_i+2"="Sj+5_1" which are "next-next identifier codes". In the same manner, the "next identifier code 1 calculating unit 11" receives, as input, "identifier code1_i+11"="Sj+4_3" which is a "next identifier code" and outputs "identifier code10_i+2"="Sj+5_2" and "identifier code11_i+2"="Sj+5_3" which are "next-next identifier codes". Through the processing by the binary data decoding unit 18, binVal="1" is outputted in the same cycle as Tj+3. Using this value, "identifier code10_i+2"="Sj+5_2", "identifier code11_i+2"="Sj+5_3" are selected from "identifier code00_i+2" "Sj+5_0", "identifier code01_i+2"="Sj+5_1", "identifier code10_i+2"="Sj+5_2", "identifier code11_i+2"="Sj+5_3" which are "next-next identifier codes", and become "identifier code0_i+2"="Sj+5_2" and "identifier code1_i+2"="Sj+5_3". In addition, the values of "identifier code0_i+2"="Sj+5_2" and "identifier code1_i+2"="Sj+5_3" are set in the next identifier code FFs 28 and 29, and the next identifier code FFs 28 and 29 output the values of "identifier code0_i+1"="Sj+5_2" and "identifier code1_i+1"="Sj+5_3" in cycle Tj+4.

Furthermore, in Tj+3 cycle, with regard to "identifier code0_i+1"="Sj+4_2" and "identifier code1_i+1"="Sj+4_3" which are "next identifier codes", "identifier code1_i+1"="Sj+4_3" is selected according to the value of binVal="1" outputted in the same cycle as Tj+3, and becomes "identifier code_i+1"="Sj+4_3". In addition, the value of "identifier code_i+1"="Sj+4_3" is set in the identifier code FF 32, and the identifier code FF 32 outputs the value of "identifier code_i"="Sj+4_3" in the subsequent cycle Tj+4.

Furthermore, the same applies with respect to the "context index". Therefore, in the subsequent cycle Tj+4, in the same manner as the outputs of the next identifier code FFs 28 and 29 become "identifier code0_i+1"="Sj+5_2" and "identifier code1_i+1"="Sj+5_3", the outputs of the next context index FFs 30 and 31 become "ctxIdx0_i+1"="Cj+5_2" and "ctxIdx1_i+1"="Cj+5_3". Furthermore, in cycle Tj+4, the output of the identifier code FF 32 becomes "identifier code_i"="Sj+4_3" and the output of the context index FF 33 becomes "ctxIdx_i"="Cj+4_3".

To summarize the above, the binary data decoding unit 18 decodes, using the probability variable outputted from the probability variable table 0 unit 16 or the probability variable table 1 unit 17, coded data obtained by converting multivalue information of syntax into binary data then performing arithmetic coding on the binary data according to Context-based Adaptive Binary Arithmetic Coding. The calculating for identifier code candidates by the next identifier code 0 calculating unit 10 and the next identifier code 1 calculating unit 11, and the calculating for context indices by the context index 00 calculating unit 12, the context index 01 calculating unit 13, the context index 10 calculating unit 14, and the context index 11 calculating unit 15 are executed in the same process cycle. The process cycle including the calculating for identifier codes by the next identifier code 0 calculating unit 10 and the next identifier code 1 calculating unit 11, and the calculating for context indices by the context index 00 calculating unit 12, the context index 01 calculating unit 13, the context index 10 calculating unit 14, and the context index 11 calculating unit 15; the process cycle in which a probability variable is outputted from the probability variable table 0 unit 16 or the probability variable table 1 unit 17, and the process cycle in which the binary data decoding unit 18 performs decoding, are executed simultaneously as a 3-staged pipeline.

Figure 3:
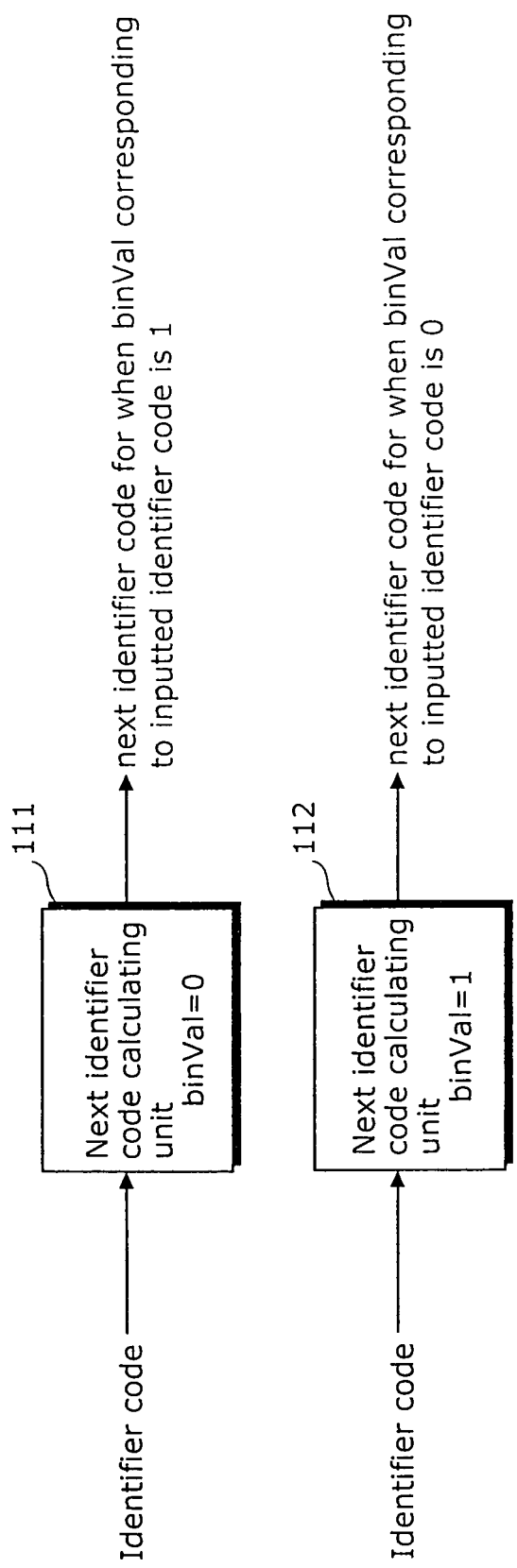
FIG. 3 is a diagram showing a modification of the next identifier code 0 calculating unit or the next identifier code 1 calculating unit in the first embodiment of the present invention.

FIG. 3 is a diagram showing a modification of the next identifier code 0 calculating unit 10 or the next identifier code 1 calculating unit 11 in FIG. 1. A next identifier code calculating unit 111 outputs the next identifier code for when the binVal corresponding to the inputted identifier code is "1", and a next identifier code calculating unit 112 outputs the next identifier code for when the binVal corresponding to the inputted identifier code is "0". Therefore, the next identifier code 0 calculating unit 10 or the next identifier code 1 calculating unit 11 in FIG. 1 may be configured of the next identifier code calculating unit 111 and the next identifier code calculating unit 112 shown in FIG. 3. Specifically, the next identifier code calculating unit 111 and the next identifier code calculating unit 112 shown in FIG. 3 may be configured in circuits which output only when responding to the 0 or 1 value of binVal.

Figure 4:
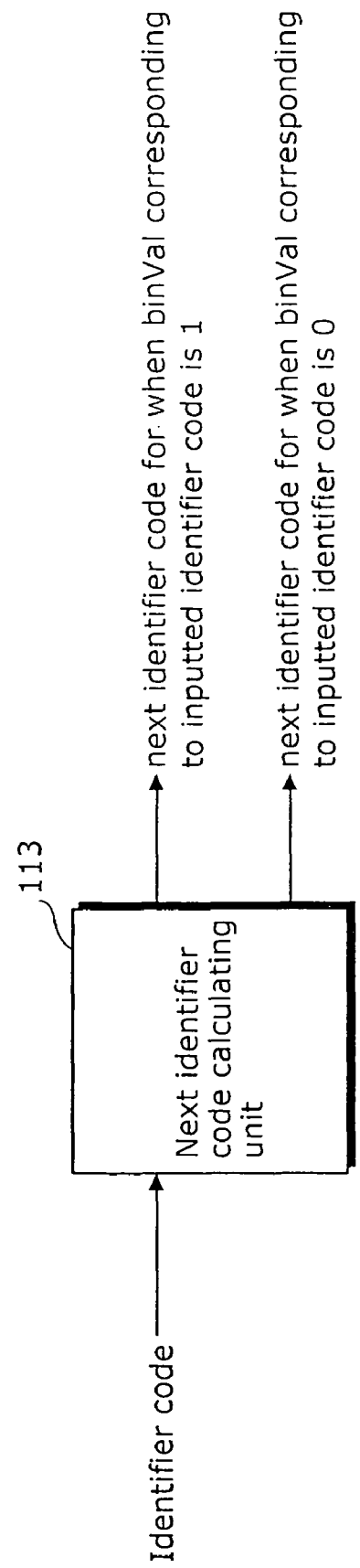
FIG. 4 is a diagram conceptually showing the functions of the next identifier code 0 calculating unit 10 or the next identifier code 1 calculating unit 11 in the first embodiment of the present invention.

FIG. 4 is a diagram conceptually showing the functions of the next identifier code 0 calculating unit 10 or the next identifier code 1 calculating unit 11 in FIG. 1. A next identifier code calculating unit 113 outputs, in response to an input of one identifier code, two next identifier codes which are the next identifier code for when the binVal corresponding to the inputted identifier code is "1" and the next identifier code for when the binVal corresponding to the inputted identifier code is "0". Therefore, the next identifier code 0 calculating unit 10 or the next identifier code 1 calculating unit 11 in FIG. 1 are configured in the next identifier code calculating unit 113 shown in FIG. 4. Specifically, the next identifier code calculating unit 111 and the next identifier code calculating unit 112 are configured in a circuit which outputs two values in response to one value.

Figure 5:
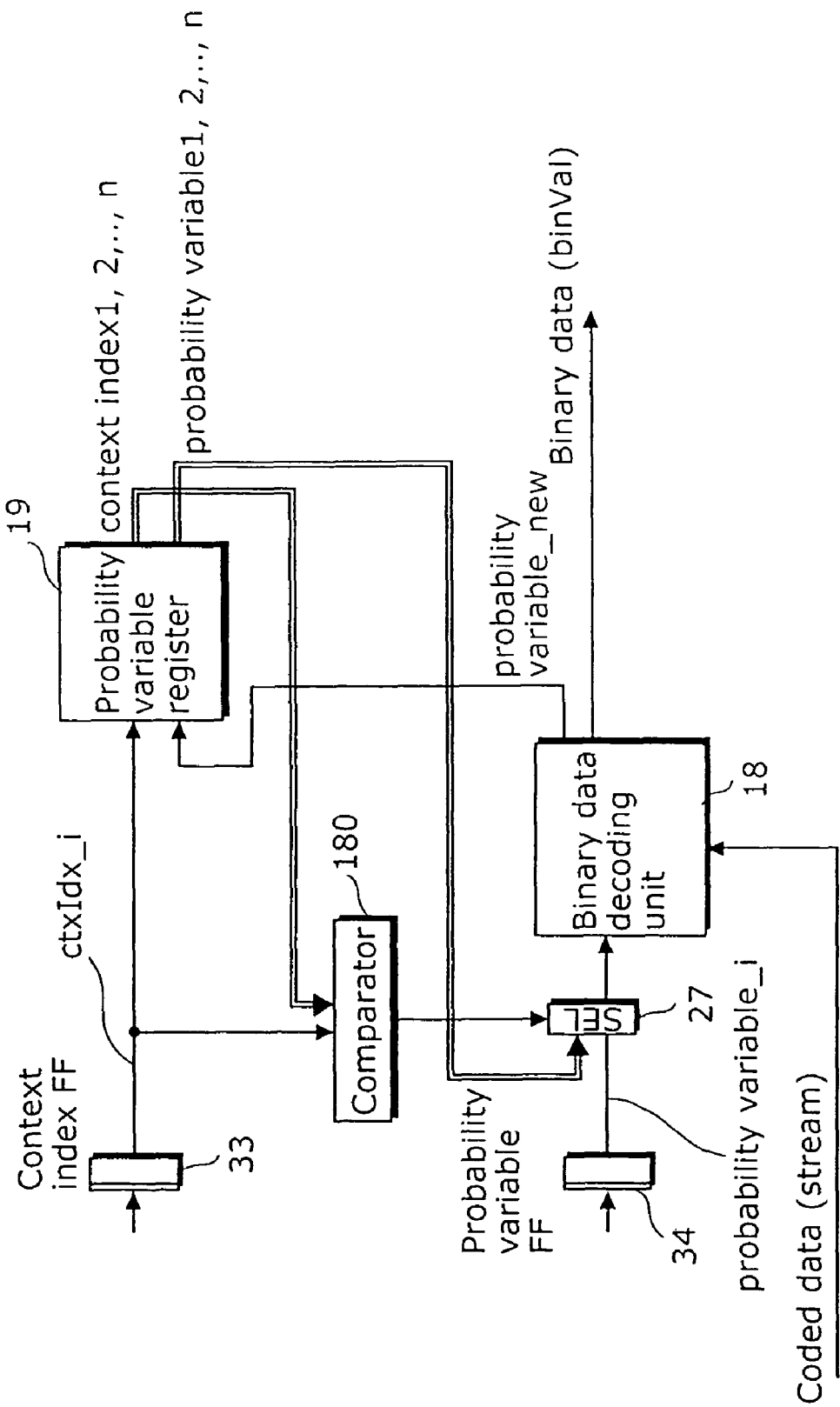
FIG. 5 is a diagram showing a circuit in which the probability variable register 19 in the first embodiment of the present invention performs the selection of a probability variable.

FIG. 5 is a diagram showing a circuit in which the probability variable register 19 in FIG. 1 performs the selection of a probability variable, and is a diagram showing in detail a circuit in the periphery of the probability variable register in FIG. 1. The circuit in FIG. 5 includes the binary data decoding unit 18, the probability variable register 19, the SEL unit 27, the context index FF 33, the probability variable FF 34, and a comparator 180.

A "probability variable_new", which is a "probability variable" that was updated in the binary data decoding unit 18, is stored in the probability variable register 19 as 1 set with a context index. The "probability variable" stored in the probability variable register 19 is deleted when its value is reflected in the probability variable table.

The comparator 180, which corresponds to the comparator in the present invention, compares the context index corresponding to the probability variable outputted by the probability variable outputting unit and the context indices held in the probability variable register.

The SEL unit 27, which corresponds to the selector in the present invention, selects, based on the result of the comparison by the comparator, one of the probability variable outputted by the probability variable outputting unit and the probability variables held in the probability variable register, and outputs the selected probability variable to the decoding unit. Specifically, the comparator 180 compares "ctxIdx_i" which is the "context index" outputted by the context index FF 33 and the "context indices" stored in the probability variable register 19. When there is a match, the SEL unit 27 selects the "probability variable" corresponding to the "context index" held by the probability variable register 19, and outputs the selected "probability variable" to the binary data decoding unit 18. When a matching context index is not present, the SEL unit 27 selects and outputs the "probability variable_i" outputted by the probability variable FF 34, to the binary data decoding unit 18.

When the probability variable register 19 holds plural "context indices" that are the same as "ctxIdx_i" which is the "context index" outputted by the context index FF 33, the SEL unit 27 selects the "probability variable" corresponding to the temporally newest-stored "context index".

By configuring the probability variable register 19 in the above-described manner, even when there is a succession of the same "context indices" and writing into the probability variable table cannot be performed in time, replacement and processing of the "probability value" is possible in the probability variable register, and thus decoding in one cycle is possible even in the range (the range indicated by C in FIG. 1) in FIG. 5.

Furthermore, by configuring the probability variable register 19 in the above-described manner, the "probability variable" candidates corresponding to the context index candidates corresponding to the next identifier code, and the "probability variable" candidates corresponding to "context index" candidates, can be used as "probability variables" without conflict.

Figure 6:
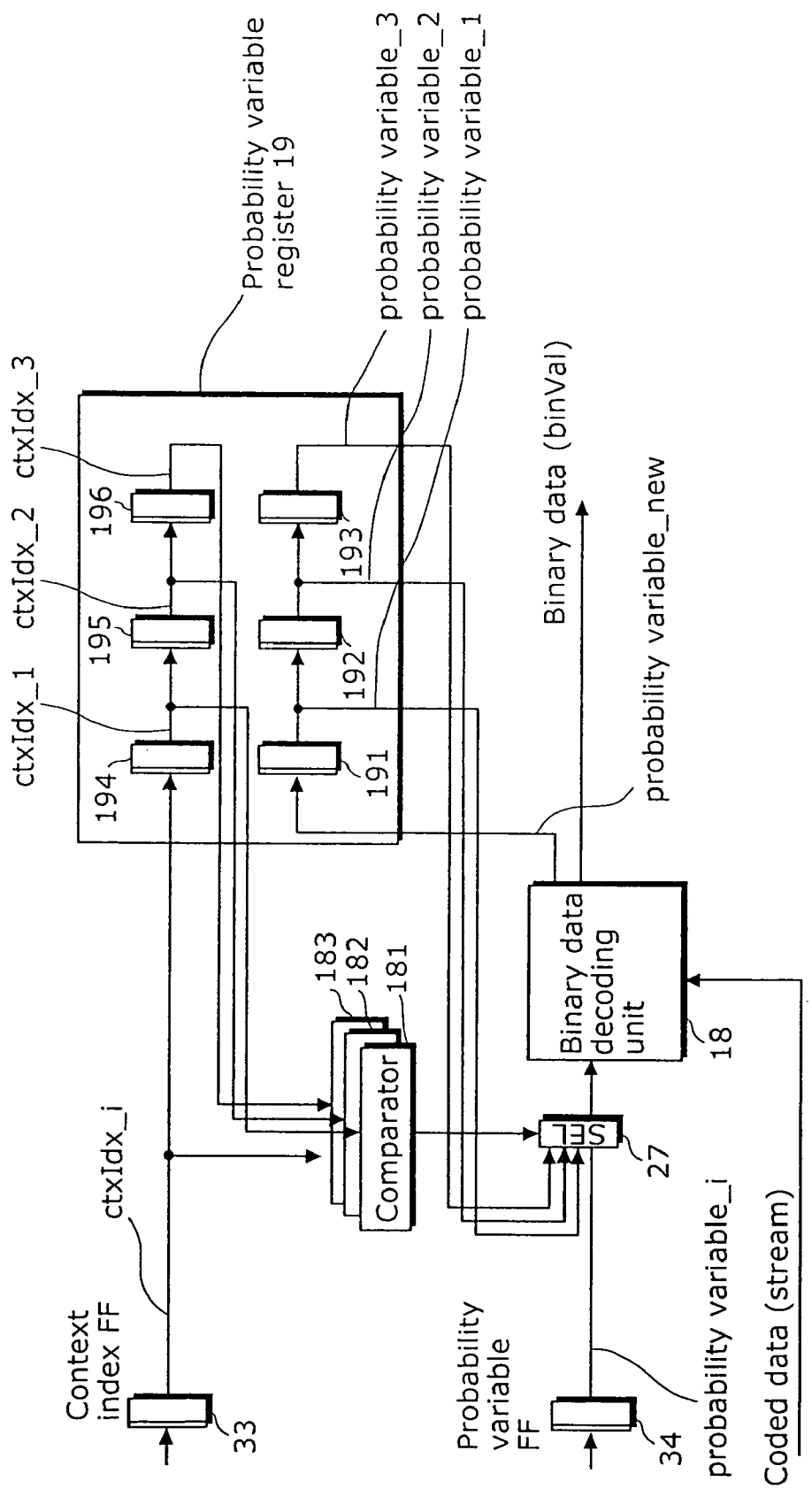
FIG. 6 is a diagram showing a modification of the probability variable register 19 in the first embodiment of the present invention.

FIG. 6 is a diagram showing a modification of the probability variable register 19 in FIG. 1. FIG. 6 shows a diagram illustrating a circuit which performs the selection of the probability variable when the probability variable register 19 is a first-in-first-out pipeline buffer configured of pipelines made up of FF 191, FF 192, FF 193, FF 194, FF 195 and FF 196.

"ctxIdx_i" which is the "context index" outputted by the context index FF 33 and the "probability variable_new" which is the "probability variable" that was updated and outputted by the binary data decoding unit 18 are inputted to the probability variable register 19 as 1 set. In the probability variable register 19, the inputted "ctxIdx_i" which is the "context index" and the "probability variable_new" which is the "probability variable" are latched by the FF 194 and the FF 191, respectively. Signals latched by the FF 194 and the FF 191 are outputted using the names "ctxIdx_1" and "probability variable_1" respectively. In the same manner, "ctxIdx_1" and "probability variable_1" are latched by FF 195 and FF 192, respectively, and are outputted through signals called "ctxIdx_2" and "probability variable 2", respectively. In addition, "ctxIdx_2" and "probability variable_2" are latched by FF 196 and FF 193, respectively, and are outputted through signals called "ctxIdx_3" and "probability variable 3", respectively.

The comparator 180 includes plural comparators such as comparators 181, 182, and 183. The comparator 180 compares "ctxIdx_i" and "ctxIdx_1" or "ctxIdx_2" or "ctxIdx_3", and judges whether or not they match. When a match for "ctxIdx_i" is found among "ctxIdx_1" or "ctxIdx_2" or "ctxIdx_3" by the comparator 180, the one of "probability variable_1" or "probability variable 2" or "probability variable_3" which is in 1 set with the matching one of "ctxIdx_1" or "ctxIdx_2" or "ctxIdx_3" is selected by SEL unit 27, and inputted to the binary data decoding unit 18. When all of "ctxIdx_i" and "ctxIdx_1" or "ctxIdx_2" or "ctxIdx_3" do not match, "probability variable_i" which is the "probability variable" outputted by the probability variable FF 34 is selected by the SEL unit 27.

When plural matches for "ctxIdx_i" are present among "ctxIdx_1" or "ctxIdx_2" or "ctxIdx_3", the one that is temporally closest to "ctxIdx_i" is selected. For example, when "ctxIdx_1" and "ctxIdx_2" match "ctxIdx_i", "ctxIdx_1" is prioritized, and "ctxIdx_1" is selected by the SEL unit 27. When "ctxIdx_2" and "ctxIdx_3" match "ctxIdx_i", "ctxIdx_2" is prioritized, and "ctxIdx_2" is selected by the SEL unit 27.

Furthermore, FIG. 6 shows an example of the case where it takes 3 cycles from when the binary data decoding unit 18 outputs "probability variable_new" which is the "probability variable" updated by the binary data decoding unit 18, to when the value of "probability variable_new" which is the "probability variable" updated by the binary data decoding unit 18 is reflected in the probability variable table included in the probability variable table 0 unit 16 or the probability variable table 1 unit 17. As such, the probability variable register 19 in FIG. 6 is configured of a 3-staged pipeline. After the 4th cycle onwards from when the binary data decoding unit 18 outputs "probability variable_new" which is the "probability variable" updated by the binary data decoding unit 18, the value of "probability variable_new" which is written into the probability variable table included in the probability variable table 0 unit 16 or the probability variable table 1 unit 17 is read from the probability variable table as "probability variable_i" which is the "probability variable".

As described thus far, the decoding apparatus in the first embodiment of the present invention receives input of the "next identifier code" of the "identifier code" corresponding to the binary data (binVal) to be decoded, and calculates "next-next identifier code" candidates through the next identifier code calculating unit. The next identifier code calculating unit calculates respective "next-next identifier code" candidates for the case where the binary data to be decoded is "0" and the case where it is "1". When the binary data decoding executed simultaneously in the decoding apparatus in the first embodiment of the present invention is completed, one out of the two "next-next identifier code" candidates calculated by the next identifier code calculating unit is selected using the decoded value (binVal), and the decoding process is performed.

Stated differently, while decoding the current binary data (binVal), the decoding apparatus in the first embodiment of the present invention calculates, parallelly in the same cycle, "next-next (2nd subsequent) identifier code" candidates and "context index" candidates corresponding to the "next-next identifier code" candidates. In addition, the decoding apparatus in the first embodiment of the present invention performs the decoding process using a technique in which the "next (immediately subsequent) identifier code", context index candidates corresponding to the next identifier code, and "probability variable" candidates corresponding to the "context index" candidates are calculated in parallel, and, at the point in time when the decoding result for the current binary data (binVal) is identified, one of the calculation results is selected in accordance with the decoding result.

Accordingly, by 3-staged pipelining of the process of decoding the binVal and the process of calculating the next identifier code, which were not executable unless the immediately preceding process in the arithmetic coding procedure is completed, it is possible to enable high-speed arithmetic decoding in the decoding of data coded according to CABAC.

It should be noted that the context index 00 calculating unit 12, the context index 01 calculating unit 13, the context index 10 calculating unit 14, and the context index 11 calculating unit 15 may be configured as one context index calculating unit. In such a case, 4 types of "context indices" for the cases where the binary data decoding unit 18 outputs "00", "01", "10", and "11", in the next process cycle and in the further subsequent process cycle. Subsequently, in response to the binary data outputted by the binary data decoding unit 18 in the immediately preceding process cycle, context indices corresponding to "00" and "01", or, "10" and "11", are selected from among the 4 types of "context indices", and the selected context indices are outputted.

Furthermore, the arithmetic decoding apparatus 100 may further include a stream supplying unit which selectively executes either supplying one stream including coded data continuously, or supplying plural streams intermittently, and the binary data decoding unit 18 may decode the coded data obtained by performing arithmetic coding according to Context-based Adaptive Binary Arithmetic Coding on the stream supplied by the stream supplying unit. The decoding apparatus in the present invention can increase the output data rate of arithmetic decoding up to the clock frequency. With this, it becomes possible to handle both the decoding of a high bit rate stream and the simultaneous decoding of plural streams of a standard bit rate (10 to 40 Mbps), and it is possible to realize a decoding apparatus including an arithmetic decoding circuit that can scalably handle various streams.

In addition, in the CABAC arithmetic decoding apparatus in the present invention, 1 bin/cycle outputting may be performed. With this, it is possible to realize a decoding apparatus which can increase the output data rate up to the clock frequency, and which allows reduction of circuit power consumption.

Second Embodiment

Next, an example of the case where identifier code_i is further inputted to the next identifier code 0 calculating unit 10 and the next identifier code 1 calculating unit 11 in the first embodiment, and the case where identifier code_i, identifier code0_i+1, and identifier code1_i+1 are further inputted to the context index 00 calculating unit 12, the context index 01 calculating unit 13, the context index 10 calculating unit 14, and the context index 11 calculating unit 15 in the first embodiment, shall be described as a second embodiment.

Figure 7:
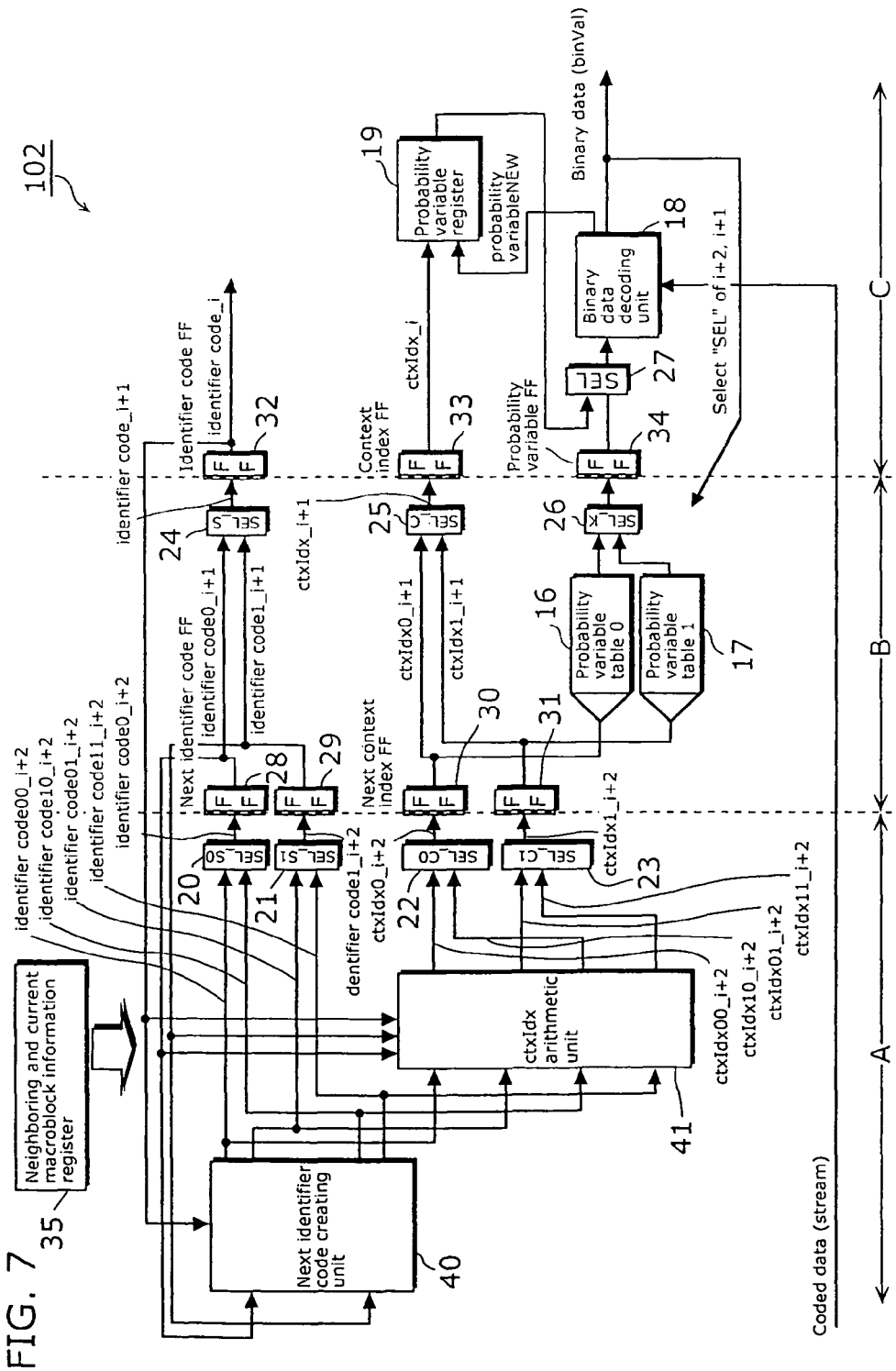
FIG. 7 is a block diagram showing the configuration of a decoding apparatus in a second embodiment of the present invention.

FIG. 7 is a block diagram showing the configuration of a decoding apparatus 102 in the second embodiment of the present invention. The same numerical reference is given to constituent elements that are the same as those in FIG. 1 and their detailed description shall be omitted.

The decoding apparatus 102 shown in FIG. 7 is different in including a next identifier code creating unit 40 in place of the next identifier code 0 calculating unit 10 and the next identifier code 1 calculating unit 11 in the first embodiment. Furthermore, the decoding apparatus 102 is different in including a ctxIdx arithmetic unit 41 in place of the context index 00 calculating unit 12, the context index 01 calculating unit 13, the context index 10 calculating unit 14, and the context index 11 calculating unit 15 in the first embodiment.

The next identifier code creating unit 40 receives, from the next identifier code FFs 28 and 29, inputs of "identifier code0_i+1" and "identifier code1_i+1" which are "next identifier codes".

The next identifier code creating unit 40 further receives, from the identifier code FF 32, input of "identifier code_i" which is an "identifier code".

The next identifier code creating unit 40 outputs, to the ctxIdx arithmetic unit 41, the SEL_S0 unit 20, and the SEL_S1 unit 21, "identifier code00_i+2", "identifier code10_i+2", "identifier code01_i+2", and "identifier code11_i+2" which are "next-next identifier codes".

The ctxIdx arithmetic unit 41 receives, from the next identifier code creating unit 40, inputs of "identifier code00_i+2", "identifier code10_i+2", "identifier code01_i+2", and "identifier code11_i+2" which are "next-next identifier codes".

The ctxIdx arithmetic unit 41 further receives, from the next identifier code FFs 28 and 29, inputs of "identifier code0_i+1" and "identifier code1_i+1" which are "next identifier codes".

The ctxIdx arithmetic unit 41 further receives, from the identifier code FF 32, input of "identifier code_i" which is an "identifier code".

The ctxIdx arithmetic unit 41 outputs, to the SEL_C0 unit 22 and the SEL_C1 unit 23, "ctxIdx00_i+2", "ctxIdx01_i+2", "ctxIdx10_i+2", and "ctxIdx11_i+2" which are to be "next-next context indices".

Figure 8:
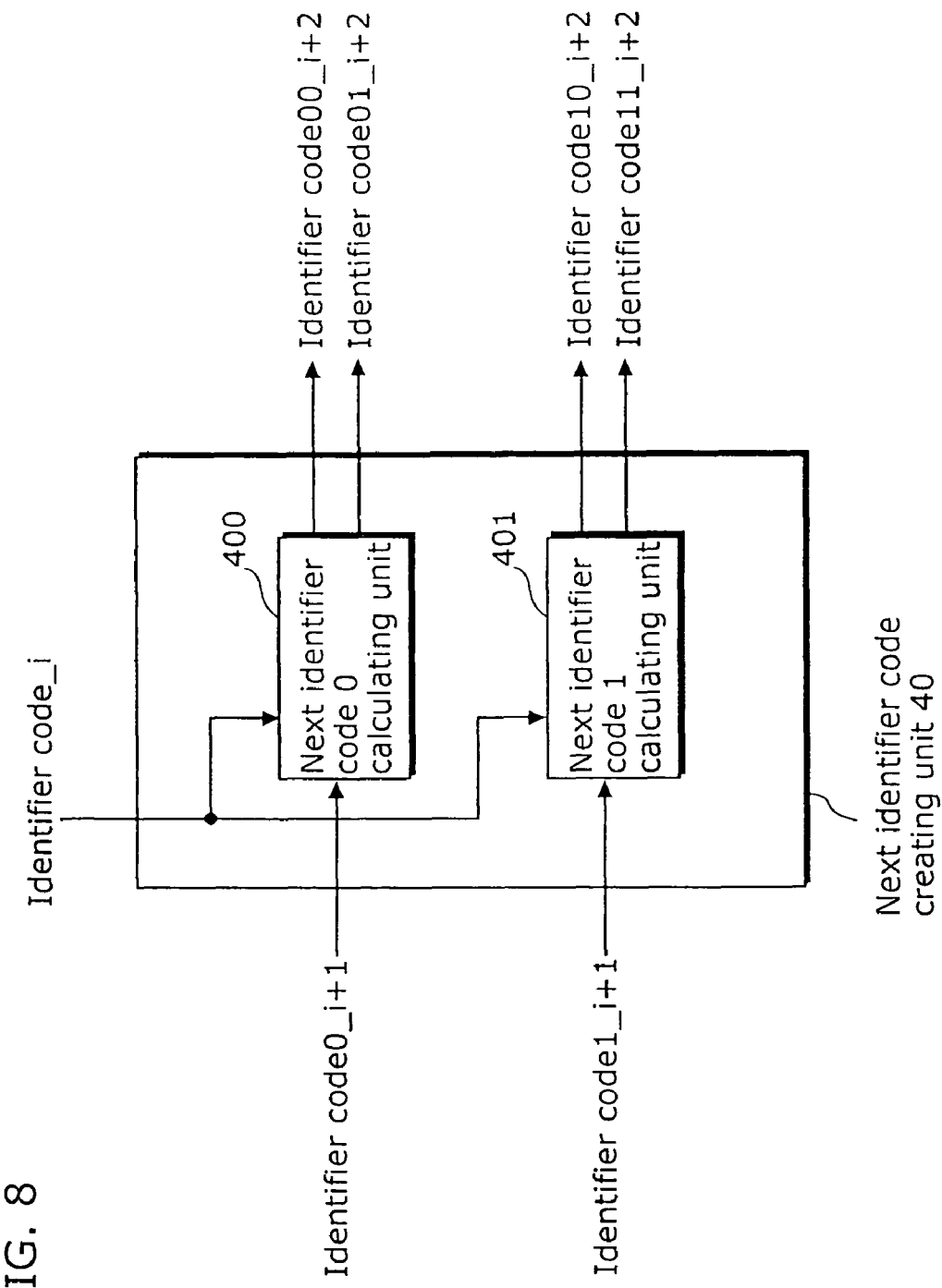
FIG. 8 is a block diagram showing the details of the next identifier code creating unit in the second embodiment of the present invention.

FIG. 8 is a diagram showing the details of the next identifier code creating unit 40.

As shown in FIG. 8, the next identifier code creating unit 40 includes a next identifier code 0 calculating unit 400 and a next identifier code 1 calculating unit 401.

The next identifier code 0 calculating unit 400 receives, as input, "identifier code0_i+1" which is a "next identifier code" and "identifier code_i" which is an "identifier code".

The next identifier code 0 calculating unit 400 outputs "identifier code00_i+2" and "identifier code01_i+2" which are "next-next identifier codes".

Furthermore, the next identifier code 1 calculating unit 401 receives, as input, "identifier code1_i+1" which is a "next identifier code" and "identifier code_i" which is an "identifier code".

The next identifier code 1 calculating unit 401 outputs "identifier code10_i+2" and "identifier code11_i+2" which are "next-next identifier codes".

The next identifier code 0 calculating unit 400 performs the arithmetic operation for the case where the value of binVal (binary data to be decoded) corresponding to "identifier code_i" which is an "identifier code" is "0", and outputs "identifier code00_i+2" and "identifier code01_i+2" which are i+2th identifier codes.

Here, "identifier code00_i+2" is the i+2th identifier code for when the value of the ith binVal is "0" and the value of the i+1th binVal is "0". The "identifier code0_i+2" is the i+2th identifier code for when the value of the ith binVal is "0" and the value of the i+1th binVal is "1".

In the same manner, the next identifier code 1 calculating unit 401 performs the arithmetic operation for the case where the value of binVal corresponding to "identifier code_i" which is an "identifier code" is "1", and outputs "identifier code10_i+2" and "identifier code11_i+2" which are i+2th identifier codes.

Here, "identifier code10_i+2" is the i+2th identifier code for when the value of the ith binVal is "1" and the value of the i+1th binVal is "0". The "identifier code11_i+2" is the i+2th identifier code for when the value of the ith binVal is "1" and the value of the i+1th binVal is "1".

The next identifier code 0 calculating unit 400 and the next identifier code 1 calculating unit 401 perform the arithmetic operations with reference to the value of an already decoded binVal and the identifier code corresponding to such binVal, from the neighboring and current macroblock information register 35. However, since the value of the ith binVal is not yet stored in the neighboring and current macroblock information register 35 at the point in time when such arithmetic operations are to be performed, instances arise where the next identifier code 0 calculating unit 400 and the next identifier code 1 calculating unit 401 are unable to perform arithmetic operations on the i+2th identifier code.

However, according to the decoding apparatus 102 in the second embodiment of the present invention, "identifier code_i" which is an "identifier code" is inputted to the next identifier code 0 calculating unit 400 and the next identifier code 1 calculating unit 401 from the identifier code FF 32, as described above. With this, when the information that is yet to be stored in the neighboring and current macroblock information register 35 becomes necessary in the arithmetic operation, arithmetic operation for the i+2th identifier code becomes possible.

Figure 9:
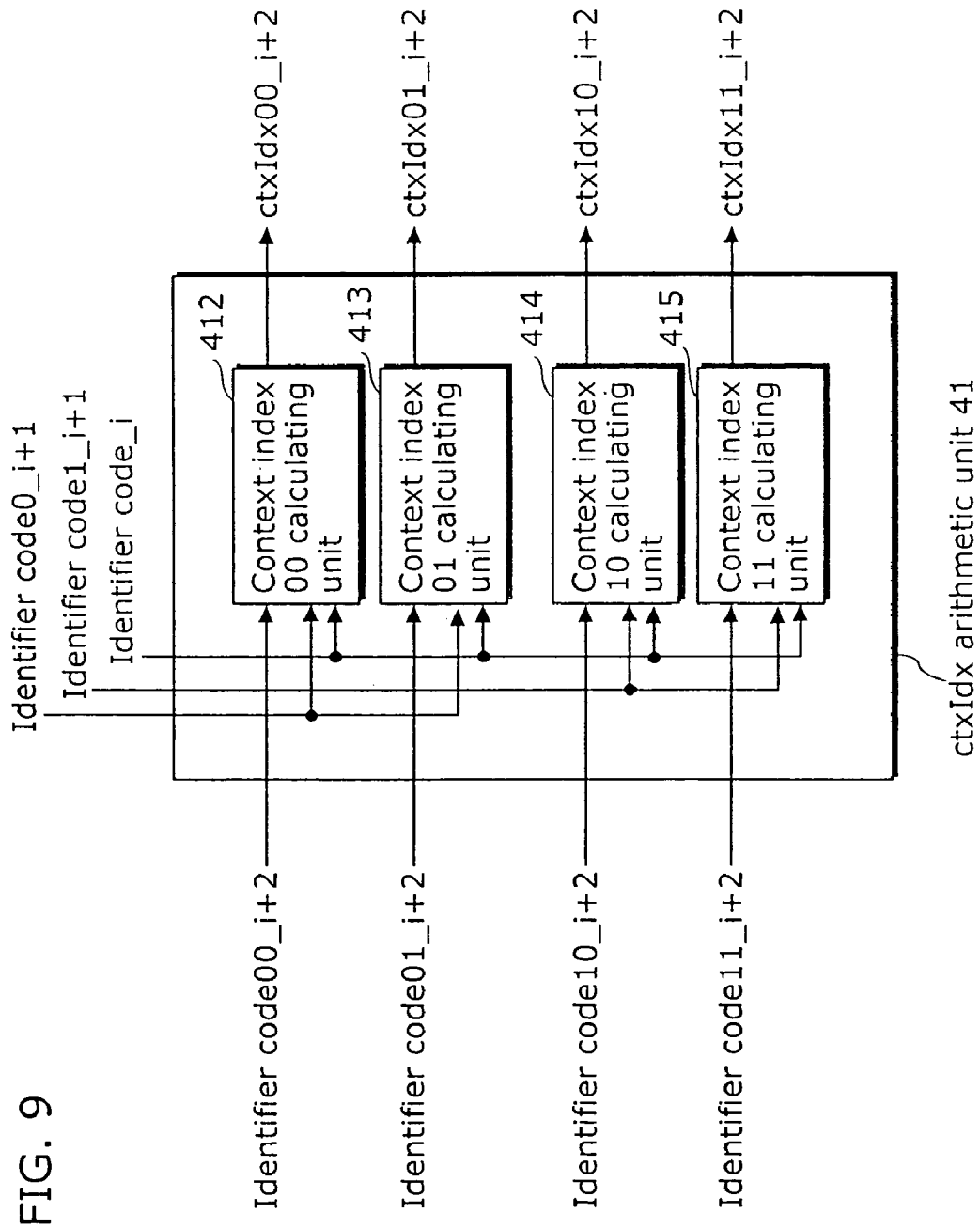
FIG. 9 is a block diagram showing the details of the ctxIdx arithmetic unit in the second embodiment of the present invention.

FIG. 9 is a diagram showing the details of the ctxIdx arithmetic unit 41.

As shown in FIG. 9, the ctxIdx arithmetic unit 41 includes a context index 00 calculating unit 412, a context index 01 calculating unit 413, a context index 10 calculating unit 414, and a context index 11 calculating unit 415.

The context index 00 calculating unit 412 receives, as input, "identifier code00_i+2" which is a "next-next identifier code", "identifier code0_i+1" which is a "next identifier code", and "identifier code_i" which is an "identifier code".

The context index 00 calculating unit 412 outputs "ctxIdx00_i+2" which is to be a "next-next context index".

In the same manner, the context index 01 calculating unit 413 receives, as input, "identifier code01_i+2" which is a "next-next identifier code", "identifier code0_i+1" which is a "next identifier code", and "identifier code_i" which is an "identifier code". The context index 01 calculating unit 413 outputs "ctxIdx01_i+2" which is to be a "next-next context index".

In the same manner, the context index 10 calculating unit 414 receives, as input, "identifier code10_i+2" which is a "next-next identifier code", "identifier code1_i+1" which is a "next identifier code", and "identifier code_i" which is an "identifier code". The context index 10 calculating unit 414 outputs "ctxIdx11_i+2" which is to be a "next-next context index".

The context index 11 calculating unit 415 receives, as input, "identifier code11_i+2" which is a "next-next identifier code", "identifier code1_i+1" which is a "next identifier code", and "identifier code_i" which is an "identifier code". The context index 11 calculating unit 415 outputs "ctxIdx11_i+2" which is to be a "next-next context index".

The context index 00 calculating unit 412 performs the arithmetic operation for when the value of the ith binVal is "0" and the value of the i+1th binVal is "0". In the same manner, the context index 01 calculating unit 413, the context index 10 calculating unit 414, and the context index 11 calculating unit 415 perform the arithmetic operation for when (the value of the ith binVal and the value of the i+1th binVal) are (0 and 1), (1 and 0), and (1 and 1), respectively.

At this time, the context index 00 calculating unit 412, the context index 01 calculating unit 413, the context index 10 calculating unit 414, and the context index 11 calculating unit 415 each receive input of identifier codes corresponding to the values of the ith binVal and the i+1th binVal.

The ctxIdx arithmetic unit 41 performs arithmetic operations using the value in the neighboring and current macroblock information register 35. However, when the ctxIdx arithmetic unit 41 executes i+2th arithmetic operation, there are cases where the value of the 1+1th binVal and the information of the identifier code corresponding to such binVal, and the value of the ith binVal and the information of the information code corresponding to such binVal are not yet stored in the neighboring and current macroblock information register 35. As such, instances arise where the ctxIdx arithmetic unit 41 is unable to perform the arithmetic operation.

However, according to the decoding apparatus 102 in the second embodiment of the present invention, "identifier code0_i+1" and "identifier code1_i+1" which are i+1th identifier codes, and "identifier code_i" which is an "identifier code", are inputted from the next identifier code FFs 28 and 29, and the identifier code FF 32, respectively, as described above. With this, even when the i+1th and the ith information are not stored in the neighboring and current macroblock information register 35, it becomes possible to execute the arithmetic operation for the i+2th ctxIdx.

Third Embodiment

In the previously described first embodiment, it becomes possible to realize an apparatus which enables high-speed arithmetic decoding in the decoding of data encoded according to CABAC. In a third embodiment, an apparatus which enables further high-speed arithmetic decoding in the decoding of data encoded according to CABAC shall be described.

Figure 10:
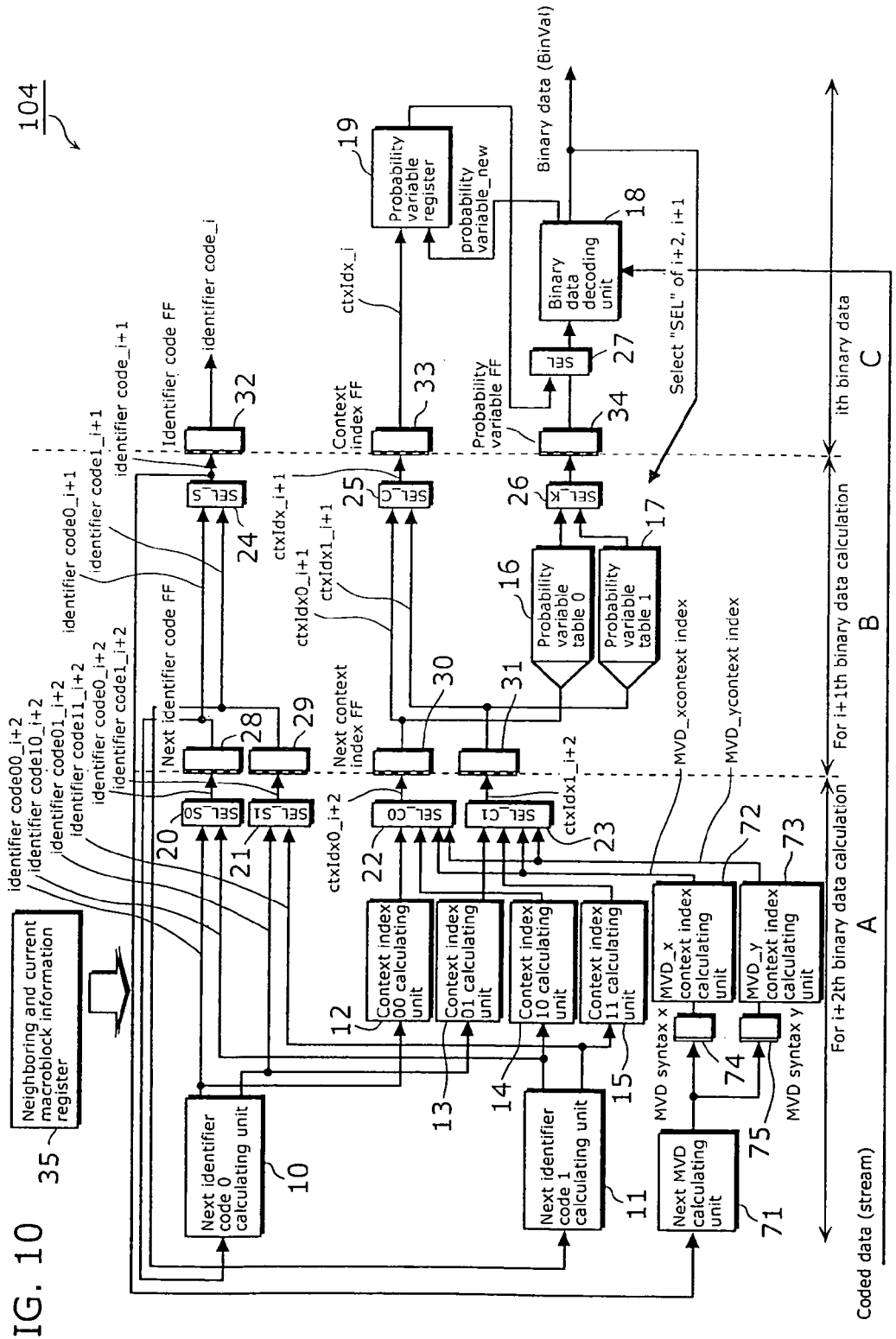
FIG. 10 is a block diagram showing the configuration of a decoding apparatus in a third embodiment of the present invention.

Hereinafter, the third embodiment of the present invention shall be described with reference to the Drawings. FIG. 10 is a block diagram showing the configuration of a decoding apparatus 104 in the third embodiment of the present invention.

The configuration in FIG. 10 is different from the configuration in FIG. 1, that is, the first embodiment, in the addition of a next MVD calculating unit 71, an MVD_x context index calculating unit 72, an MVD_y context index calculating unit 73, an MVD syntax x FF 74 and an MVD syntax y FF 75.

In the case where an identifier code indicates a motion vector (hereafter denoted as MVD), the MVD context index calculation involves a large amount of processing since there are many types of MVD and searching (associating) is complicated. As such the process time for the cycle of the range indicated by "for i+2th binary data calculation" in FIG. 1 becomes long. Consequently, by separating the processing for when an identifier code indicates an MVD, high-speed arithmetic decoding becomes possible in the decoding of data encoded according to CABAC.

MVD appears alternately as MVD_x and MVD_y. The circuit in FIG. 10 is configured utilizing this fact. Specifically, in FIG. 10, the MVD context index calculation is made separately by calculating the identifier code indicating "next MVD_x" when the identifier code indicates MVD_x, and calculating the identifier code indicating "next MVD_y" when the identifier code indicates MVD_y.

The next MVD calculating unit 71, which corresponds to the MVD calculating unit in the present invention, calculates the next MVD vector when the inputted identifier code indicates MVD. Specifically, the next MVD calculating unit 71 receives, as input, "identifier code_i+1" outputted by the SEL_S unit 24, and calculates the identifier code of the "next MVD", when the value of "identifier code_i+1" is MVD.

When the identifier code outputted by the next MVD calculating unit 71 is MVD_x, the value thereof is set in the MVD syntax x FF 74. Alternatively, when "identifier code_i+1" outputted by the SEL_S unit 24 is MVD_x, the identifier code outputted by the next MVD calculating unit 71 may be set in the MVD syntax x FF 74.

When the identifier code outputted by the next MVD calculating unit 71 is MVD_y, the value thereof is set in the MVD syntax y FF 75. Alternatively, when "identifier code_i+1" is MVD_y, the identifier code outputted by the next MVD calculating unit 71 may be set in the MVD syntax y FF 75.

Here, the identifier code shall be outputted from the MVD syntax x FF 74 and the MVD syntax y FF 75.
The binIdx for the identifier code is always 0.

The MVD_x context index calculating unit 72, which corresponds to the MVD context index calculating unit in the present invention, receives input of the identifier code of the MVD vector and calculates a context index. Specifically, the MVD_x context index calculating unit 72 calculates the "context index" corresponding to the identifier code of MVD_x outputted by the MVD syntax x FF 74, and outputs the calculation result, as "MVD_x context index", to the SEL_C 0 unit 22 and the SEL_C 1 unit 23.

The MVD_y context index calculating unit 73, which corresponds to the MVD context index calculating unit in the present invention, receives input of the identifier code of the MVD vector and calculates a context index. Specifically, the MVD_y context index calculating unit 73 calculates the "context index" corresponding to the identifier code of MVD_y outputted by the MVD syntax y FF 75, and outputs the calculation result, as "MVD_y context index", to the SEL_C 0 unit 22 and the SEL_C 1 unit 23.

When the value of "identifier code0_i+2" is MVD_x and binIdx=0, the SEL_C 0 unit 22 selects "MVD_x context index" as a "next-next context index". When the value of "identifier code0_i+2" is MVD_y and binIdx=0, the SEL_C 0 unit 22 selects "MVD_y context index" as a "next-next context index". When the value of "identifier code00_i+2" which is to be a "next identifier code" is other than the above-mentioned values, the SEL_C0 unit 22 selects "ctxIdx00_i+2" as a "next-next context index" when binVal=0, and selects "ctxIdx10_i+2" as a "next-next context index" when binVal=1. The selected context index is outputted from the SEL_C 0 unit 22 as "ctxIdx0_i+2".

When the value of "identifier code1_i+2" is MVD_x and binIdx=0, the SEL_C 1 unit 23 selects "MVD_x context index" as a "next-next context index". When the value of "identifier code1_i+2" is MVD_y and binIdx=0, the SEL_C 1 unit 23 selects "MVD_y context index" as a "next-next context index". When the value of "identifier code00_i+2" which is to be a "next identifier code" is other than the above-mentioned values, the SEL_C1 unit 23 selects "ctxIdx01_i+2" as a "next-next context index" when binVal=0, and selects "ctxIdx11_i+2" as a "next-next context index" when binVal=1. The selected context index is outputted from the SEL_C 1 unit 23 as "ctxIdx1_i+2".

Figure 11:
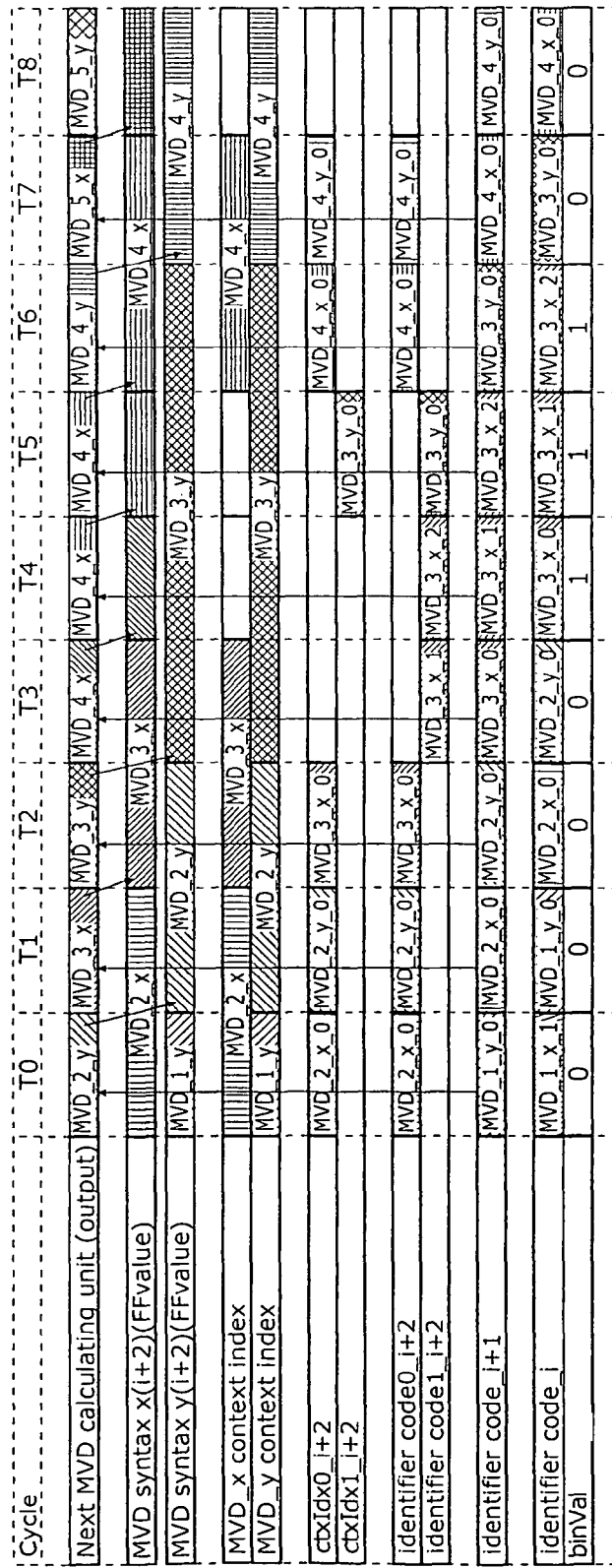
FIG. 11 is a diagram showing an example of a timing chart for when the image decoding apparatus in the third embodiment of the present invention operates.

FIG. 11 is a diagram showing an example of a timing chart for when the decoding apparatus 104 in FIG. 10 operates. In the timing chart, "MVD_1_y_0" indicates an identifier code for block index=1 within a macroblock, MVD_y and binIdx=0. The block index is an index that is assigned to a 4×4 pixel block when a macroblock (16×16 blocks) is divided into blocks of 4×4 pixels. A block index assumes a value of 0 to 15.

For example, in cycle T0 in FIG. 8, the value of "identifier code_i+1" is MVD_1_y_0. The next MVD calculating unit 71 receives, as input, this value, and outputs MVD_2_y which is to be the identifier code for "next MVD".

MVD_2_y, which is the value of the identifier code MVD_y outputted by the next MVD calculating unit 71, is set in the MVD syntax y FF 75.

In the subsequent cycle T1, the MVD_y context index calculating unit 73 receives, as input, MVD_2_y which is the value set in the MVD syntax y FF 75, calculates a "context index" corresponding to identifier code=MVD_2_y, and outputs this as "MVD_y context index" to the SEL_C 0 unit 22 and the SEL_C 1 unit 23.

In cycle t1, since the value of "identifier code0_i+2" is MVD_y and binIdx=0, the SEL_C 0 unit 22 selects "MVD_y context index" as a "next-next context index" and outputs "ctxIdx0_i+2"="MVD_y context index" to the next context index FF 30. Specifically, "ctxIdx0_i+2" becomes "MVD_y context index"=(context index value of MVD_2_y_0).

Furthermore, in cycle T1, the value of "identifier code_i+1 is MVD_2_x_0. The next MVD calculating unit 71 receives such value as input, and outputs MVD_3_x as a "next MVD" to the MVD syntax x FF 74.

MVD_3_x which is the value of the identifier code MVD_x outputted by the next MVD calculating unit 71 is set in the MVD syntax x FF 74.

In cycle T2, the MVD_x context index calculating unit 72 receives, as input, MVD_3_x which is the value set in the MVD syntax x FF 74, calculates a "context index" corresponding to identifier code=MVD_3_x, and outputs this as "MVD_x context index" to the SEL_C 0 unit 22 and the SEL_C 1 unit 23.

In cycle t2, since the value of "identifier code0_i+2" is MVD_x and binIdx=0, the SEL_C 0 unit 22 selects "MVD_x context index" as a "next-next context index" and outputs "ctxIdx0_i+2"="MVD_x context index" to the next context index FF 30.

Furthermore, although the value of "identifier code_i+1" is MVD_3_x_0, MVD_3_x_1, and MVD_3_x_2 in cycle T3, cycle T4, and cycle T5, respectively, the values outputted by the next MVD calculating unit 71 are all MVD_4_x. In cycle T3, cycle T4, and cycle T5, the same value of MVD_4_x is set in the MVD syntax x FF 74.

Figure 12:
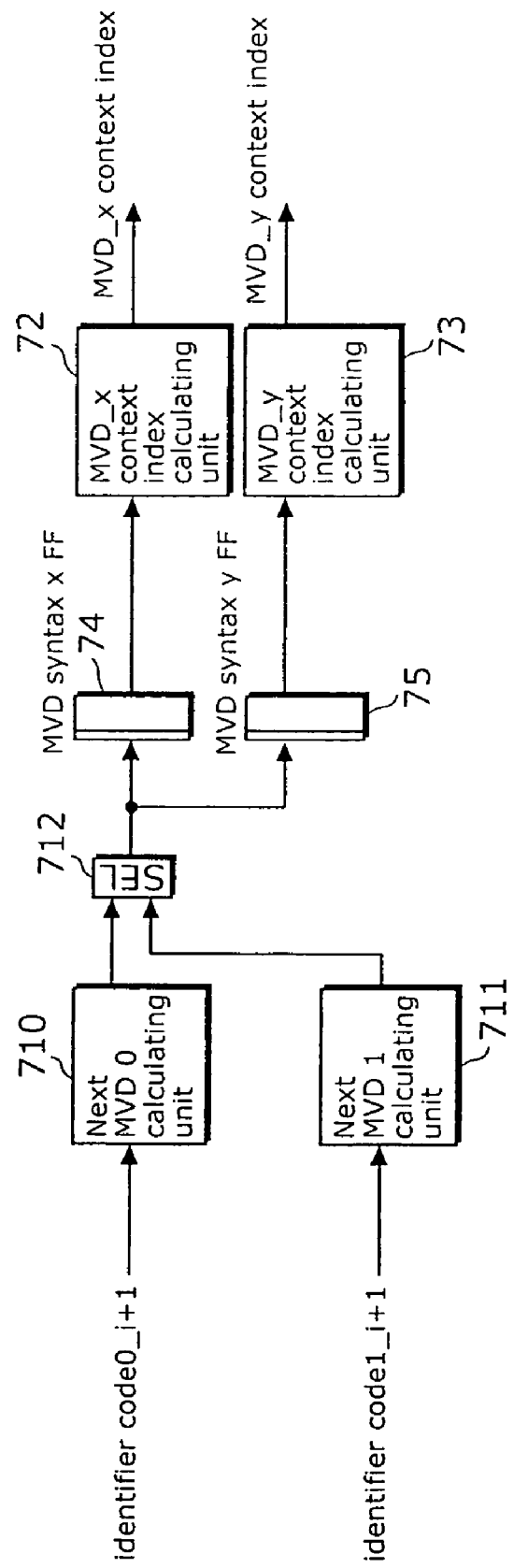
FIG. 12 is a block diagram showing a modification of the configuration of the next MVD calculating unit 71 in the third embodiment of the present invention.

FIG. 12 is a block diagram showing a modification of the configuration of the next MVD calculating unit 71 in FIG. 10. The configuration in FIG. 12 is different from the configuration in FIG. 10 in that the next MVD calculating unit 71 is replaced with a next MVD 0 calculating unit 710 and a next MVD 1 calculating unit 711, and in the addition of a SEL 712.

The next MVD 0 calculating unit 710 receives, as input, "identifier code0_i+1", and calculates the identifier code of the "next MVD" when the value of "identifier code0_i+1" is MVD.

The next MVD 1 calculating unit 711 receives, as input, "identifier code1_i+1" which is a "next identifier code", and calculates the identifier code of the "next MVD" when the value of "identifier code1_i+1" is MVD.

The SEL 712 selects either the output from the next MVD 0 calculating unit 710 or the output from the next MVD 1 calculating unit 711, according to the value of binVal. The SEL 712 selects the output from the next MVD 0 calculating unit 710 when binVal=0, and selects the output from the next MVD 1 calculating unit 711 when binVal=1. The value selected by the SEL 712 is inputted to the MVD syntax x FF 74 or the MVD syntax y FF 75, in the same manner as that in FIG. 7.

When the identifier code outputted by the SEL 712 is MVD_x, the value thereof is set in the MVD syntax x FF 74. Alternatively, when "identifier code_i+1" is MVD_x, the identifier code outputted by the SEL 712 may be set in the MVD syntax x FF 74.

Furthermore, when the identifier code outputted by the SEL 712 is MVD_y, the value thereof is set in the MVD syntax y FF 75. Alternatively, when "identifier code_i+1" is MVD_y, the identifier code outputted by the SEL 712 may be set in the MVD syntax x FF 74.

As described above, in the case where the value of an identifier code indicates a motion vector (MVD), the MVD context index calculation involves a large amount of processing since there are many types of MVD and searching (associating) is complicated. Consequently, the decoding apparatus in the third embodiment of the present invention utilizes the fact that MVD appears alternately as MVD_x and MVD_y, and separates the process of calculating the context index for when the identifier code is an MVD. Specifically, by including the next MVD calculating unit 71 which calculates the identifier code of the next MVD vector in a sequence of identifier codes, the MVD_x context index calculating unit 72 and the MVD_y context index calculating unit 73 which respectively calculate a context index from the value of the MVD calculated by the next MVD calculating unit 71, the context index selection circuit can select the context that is separately calculated by the MVD context calculating unit, when the value of the identifier code is MVD. With this, it becomes possible to realize high-speed arithmetic decoding in the decoding of data encoded according to CABAC.

Therefore, according to the CABAC arithmetic decoding apparatus in the present invention, it becomes possible to increase the speed of the circuit for calculating the context index, by including MVD calculating units in parallel, and thus at least a 10 to 20% increase in the speed of the circuit is realized and an improvement in decoding performance of at least 10 to 20% becomes possible.

Fourth Embodiment

Figure 13:
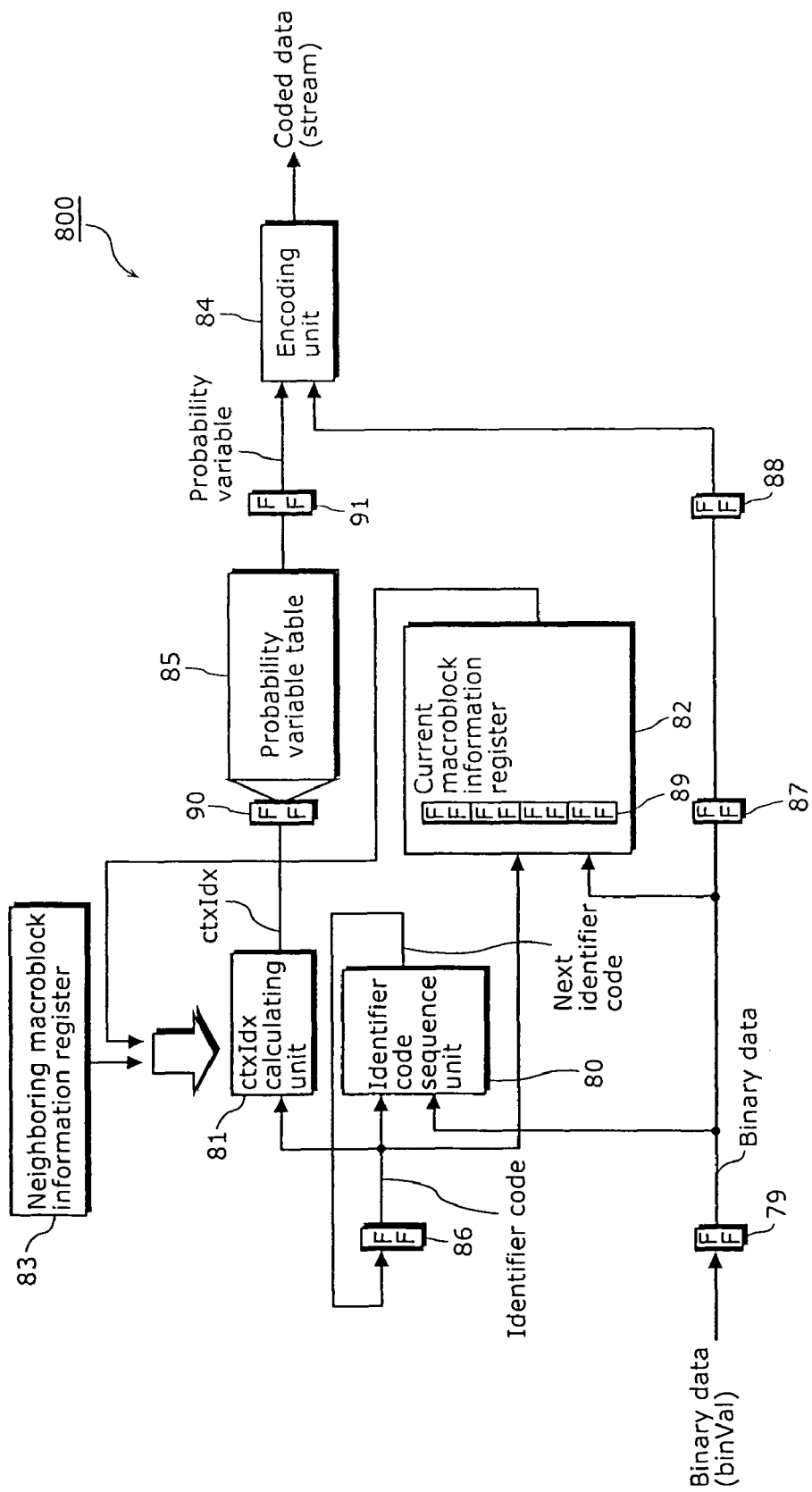
FIG. 13 is a block diagram showing the configuration of a coding apparatus in a fourth embodiment of the present invention.

FIG. 13 is a block diagram showing the configuration of a coding apparatus 800 in a fourth embodiment of the present invention. The coding apparatus 800 is an arithmetic coding apparatus which receives, as input, a sequence of data obtained by converting multivalue information of syntax into binary data in Context-based Adaptive Binary Arithmetic Coding, and outputs coded data coded using arithmetic coding. As shown in FIG. 13, the coding apparatus 800 includes an identifier code sequence unit 80, a ctxIdx calculating unit 81, a current macroblock information register 82, a neighboring macroblock information register 83, an encoding unit 84, and a probability variable table 85. The coding apparatus 800 further includes FFs 79, 86, 87, 88, 89, 90, and 91.

The identifier code sequence unit 80 receives, as input, an identifier code from the FF 86, binary data corresponding to such identifier code from the FF 79, information stored in the current macroblock information register 82, and information stored in the neighboring macroblock information register 83.

The identifier code sequence unit 80 calculates the next identifier code from the identifier code, and outputs the calculated next identifier code to the FF 86.

The ctxIdx calculating unit 81 receives, as input, an identifier code from the FF 86, information stored in the current macroblock information register 82, and information stored in the neighboring macroblock information register 83.

The ctxIdx calculating unit 81 calculates the value of ctxIdx corresponding to the inputted identifier code, and outputs the calculated value of ctxIdx to the FF 90.

The current macroblock information register 82 receives, as input, an identifier code from the FF 86, and binary data corresponding to such identifier code from the FF 79.

The current macroblock information register 82 generates information on the macroblock which is the current coding target, and stores the information in the FF 89. The current macroblock information register 82 outputs the information on the macroblock stored in the FF 89, to the ctxIdx calculating unit 81 and the identifier code sequence unit 80.

The neighboring macroblock information register 83 stores, out of information on macroblocks neighboring the macroblock which is the current coding target, information which is referred to by the ctxIdx calculating unit 81 or the identifier code sequence unit 80. The neighboring macroblock information register 83 outputs the information stored therein to the ctxIdx calculating unit 81 and the identifier code sequence unit 80.

The probability variable table 85 receives, as input, ctxIdx from the FF 90, and selects the probability variable corresponding to ctxIdx. The probability variable table 85 outputs the selected probability variable to the FF 91.

The encoding unit 84 receives, as input, the probability variable from the FF 91 and the binary data from the FF 88, performs arithmetic coding on the binary data, and outputs coded data (stream).

Next, the operation of the coding apparatus 800 shall be described.

First, in the coding apparatus 800, binary data is inputted to the FF 79 from the decoding apparatus 100, 102, or 104.

Next, the FF 79 simultaneously outputs the binary data to the identifier code sequence unit 80, the current macroblock information register 82, and the FF 87.

The binary data from the FF 79 and the identifier code corresponding to the binary data is inputted simultaneously to the identifier code sequence unit 80.

Next, the identifier code sequence unit 80 calculates the next identifier code, and outputs the calculated next identifier code to the FF 86. The next identifier code outputted at this time is used as the identifier code corresponding to the binary data that is to be inputted next.

Next, the FF 86 outputs the identifier code corresponding to the binary data to the ctxIdx calculating unit 81, the identifier code sequence unit 80, and the current macroblock information register 82.

The ctxIdx calculating unit 81 calculates the ctxIdx corresponding to the inputted identifier code.

The ctxIdx calculating unit 81 outputs the calculated ctxIdx to the FF 90.

Next, the FF 90 outputs the inputted ctxIdx to the probability variable table 85.

The probability variable table 85 reads the probability variable corresponding to the inputted ctxIdx. The probability variable table 85 outputs the read probability variable to the FF 91.

Next, the binary data from the FF88, that is, the binary data inputted to the coding apparatus 800, and the probability variable corresponding to the binary data, from the FF 91, are inputted to the encoding unit 84.

The encoding unit 84 performs arithmetic coding using the inputted binary data and the probability variable, that is, the encoding unit 84 codes the binary data. The encoding unit 84 outputs the coded data.

It should be noted that the ctxIdx calculating by the ctxIdx calculating unit 81 and the searching and outputting of probability variables by the probability variable table 85, and the arithmetic coding by the encoding unit 84 make up a pipeline and are simultaneously performed on successive binary data.

As described above, in the coding apparatus 800, by setting identifier codes corresponding to the syntax element and binIdx to which the inputted binary data belongs, and calculating the identifier code corresponding to the next binary data through the identifier code sequence unit 80, the sequence processing of the syntax element and binIdx is made possible. With this, high-speed coding and coding circuit reduction can be realized.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be used in a decoding apparatus which decodes data coded using CABAC, and in a coding apparatus which codes data using CABAC. Particularly, the present invention can be used in a decoding apparatus for reproducing hi-vision images coded using data compression technology standardized by AVC/H.264, and in a coding apparatus for coding hi-vision images using data compression technology standardized by AVC/H.264.

What is claimed is:

1. An arithmetic decoding apparatus which decodes coded data obtained by converting multivalue information of syntax into binary data and performing context-based adaptive binary arithmetic coding on the binary data, said arithmetic decoding apparatus comprising:
    a binary data decoder configured to decode the coded data to output binary data;
    an identifier code calculator configured to calculate next identifier codes upon receiving input of an identifier code uniquely corresponding to a syntax element to which the binary data belongs;
    a context index calculator configured to calculate context indices respectively corresponding to each of the next identifier codes calculated by said identifier code calculator, the context indices being calculated from among context indices which are identification numbers assigned on a per classification basis to the binary data classified by the identifier code and neighboring information; and
    a probability variable outputter having a probability variable table holding probability variables corresponding to the context indices, and configured to output probability variables respectively corresponding to the context indices calculated by said context index calculator,
    wherein in a process cycle in which said binary data decoding unit outputs 1-bit binary data:
    said binary data decoder is configured to execute the decoding by using one of the probability variables outputted by said probability variable outputter;
    the calculating for the next identifier codes by said identifier code calculator and the calculating for the context indices by said context index calculator are executed within the process cycle; and
    the outputting of the probability variables respectively corresponding to the context indices is executed within the process cycle, and
    a process cycle including the calculating for the next identifier codes by said identifier code calculator and the calculating for the context indices by said context index calculator, a process cycle for the outputting of the probability variables by said probability variable outputter, and a process cycle for the decoding by said binary data decoder are executed simultaneously as a three-staged pipeline.

2. The arithmetic decoding apparatus according to claim 1, wherein said identifier code calculating unit is configured to output the next identifier code for when the binary data corresponding to the inputted identifier code is "0" and the next identifier code for when the binary data corresponding to the inputted identifier code is "1".

3. The arithmetic decoding apparatus according to claim 1, wherein the identifier code and the next identifier codes each include binIdx which is information specifying a position of binary data in a sequence of the binary data making up the multivalue information.

4. The arithmetic decoding apparatus according to claim 1, wherein a current identifier code corresponding to binary data being decoded in a current process cycle is further inputted to said identifier code calculator.

5. The arithmetic decoding apparatus according to claim 1, wherein the next identifier codes having 2-bit information are inputted to said context index calculator, the information indicating that binary data currently being decoded is "0" and binary data to be decoded next is "0", that the binary data currently being decoded is "0" and the binary data to be decoded next is "1", that the binary data currently being decoded is "1" and the binary data to be decoded next is "0", or that the binary data currently being decoded is "1" and the binary data to be decoded next is "1".

6. The arithmetic decoding apparatus according to claim 5, wherein an identifier code that immediately precedes the next identifier code and a current identifier code corresponding to the binary data currently being decoded are further inputted to said context index calculator.

7. The arithmetic decoding apparatus according to claim 1, wherein said identifier code calculating unit is configured to:
calculate first next identifier codes corresponding respectively to next-next binary data to be decoded in a next-next process cycle, when an identifier code corresponding to binary data "0" decoded in a current process cycle and a next binary data "0" or "1" to be decoded in the next process cycle is inputted, the binary data and the next binary data being decoded by said binary data decoder;
further calculate second next identifier codes corresponding respectively to next-next binary data to be decoded in a next-next process cycle, when an identifier code corresponding to binary data "1" decoded in a current process cycle and a next binary data "0" or "1" to be decoded in the next process cycle is inputted, the binary data and the next binary data being decoded by said binary data decoder; and
select either the first next identifier codes or the second identifier codes, depending on the binary data decoded and outputted in the current process cycle by said binary data decoder, and output the selected one of the first next identifier codes and the second identifier codes.

8. The arithmetic decoding apparatus according to claim 7, wherein said identifier code calculating unit is configured to:
select the first next identifier codes corresponding respectively to (the binary data, the next binary data)=(0, 0) and (0, 1) and output the selected first next identifier codes as next identifier codes, when the binary data decoded and outputted in the current process cycle is "0"; and
select the second next identifier codes corresponding respectively to (the binary data, the next binary data)=(1, 0) and (1, 1) and output the selected second next identifier codes as next identifier codes, when the binary data decoded and outputted in the current process cycle is "1".

9. The arithmetic decoding apparatus according to claim 1, wherein, said context index calculator is configured to:
calculate, in a current processing cycle and a next processing cycle, four types of context indices including: a context index corresponding to next-next binary data to be decoded after-the-next when outputting (binary data being decoded in the current process cycle, binary data to be decoded in the next processing cycle)=(0, 0); a context index corresponding to next-next binary data to be decoded after-the-next when outputting (0, 1); a context index corresponding to next-next binary data to be decoded after-the-next when outputting (1, 0); and a context index corresponding to next-next binary data to be decoded after-the-next when outputting (1, 1), and
select, from among the four types of context indices, two types of context indices corresponding respectively to (0, 0) and (0, 1), or two types of context indices corresponding respectively to (1, 0) and (1, 1), depending on the binary data outputted in the current cycle by the binary data decoder, and output the selected two types of context indices.

10. The arithmetic decoding apparatus according to claim 1,
wherein a first context index and a second context index are inputted to said probability variable outputter, the first context index corresponding to binary data to be decoded in the next process cycle when said binary data decoder outputs binary data "0" in a current process cycle, and the second context index corresponding to binary data to be decoded in the next process cycle when said binary data decoder outputs binary data "1" in a current process cycle, and
said probability variable outputter is configured to:
output two types of the probability variables including a first probability variable corresponding to the first context index, and a second probability variable corresponding to the second context index; and
select, from among the two types of probability variables, either the first probability variable corresponding to the binary data "0" or the second probability variable corresponding to the binary data "1", depending on the binary data outputted in the current cycle by said binary data decoding unit, and output the selected one of the first probability variable and the second probability variable.

11. The arithmetic decoding apparatus according to claim 1,
wherein said binary data decoder includes:
a decoder configured to execute the decoding to output a new probability variable corresponding to a result of the decoding and a context index corresponding to the probability variable;
a probability variable register which holds the probability variable outputted by said decoder and the context index;
a comparator which compares the context index corresponding to the probability variable outputted by said probability variable outputting unit and the context index held in said probability variable register; and
a selector which selects the probability variable held in said probability variable register, out of the probability variable outputted by said probability variable outputter and the probability variable held in said probability register, when a result of the comparison is a match.

12. The arithmetic decoding apparatus according to claim 11,
wherein said probability variable register is a first-in-first-out pipeline buffer.

13. The arithmetic decoding apparatus according to claim 1, further comprising:
an MVD calculator configured to calculate an identifier code indicating a next MVD vector upon receiving input of the identifier code, when a value of the identifier code indicates an MVD vector which is a motion vector in a moving picture;
an MVD context index calculator configured to calculate a context index upon receiving input of the identifier code calculated by said MVD calculator; and a context index selector configured to select one of the context index calculated by said context index calculator and the context index calculated by said MVD context index calculator, depending on the value of the identifier code.

14. The arithmetic decoding apparatus according to claim 13,
wherein the identifier code inputted to the MVD calculator is an identifier code present in the process cycle for the outputting of the probability variables by said probability variable outputter.

15. The arithmetic decoding apparatus according to claim 1, further comprising
a stream supplier configured to selectively execute supplying one stream including coded data continuously or supplying plural streams intermittently,
wherein said binary data decoder is configured to perform the decoding on the stream supplied by said stream supplier.

16. An arithmetic decoding apparatus which decodes coded data obtained by converting multivalue information of syntax into binary data and performing context-based adaptive binary arithmetic coding on the binary data, said arithmetic decoding apparatus comprising:
a binary data decoder configured to decode the coded data to output binary data;
an identifier code calculator configured to calculate next identifier codes upon receiving input of an identifier code;
a context index calculator configured to calculate context indices respectively corresponding to the next identifier codes calculated by said identifier code calculator, the context indices being calculated from among context indices which are identification numbers assigned on a per classification basis to the binary data classified by the identifier code and neighboring information;
a probability variable outputter having a probability variable table holding probability variables corresponding to the context indices, and configured to output probability variables respectively corresponding to the context indices calculated by said context index calculator;
an MVD calculator configured to calculate an identifier code indicating a next MVD vector upon receiving input of the identifier code, when a value of the identifier code indicates an MVD vector which is a motion vector in a moving picture;
an MVD context index calculator configured to calculate a context index upon receiving input of the identifier code calculated by said MVD calculator; and
a context index selector configured to select one of the context index calculated by said context index calculator and the context index calculated by said MVD context index calculator, depending on the value of the identifier code,
wherein, in a process cycle in which said binary data decoder outputs 1-bit binary data, said binary data decoder is configured to perform the decoding by using one of the probability variables outputted by said probability variable outputter.

17. A semiconductor integrated circuit for arithmetic decoding, which decodes coded data obtained by converting multivalue information of syntax into binary data and performing context-based adaptive binary arithmetic coding on the binary data, said semiconductor integrated circuit comprising:
a binary data decoding circuit configured to decode the coded data to output binary data;
an identifier code calculating circuit configured to calculate next identifier codes upon receiving input of an identifier code uniquely corresponding to a syntax element to which the binary data belongs;
a context index calculating circuit configured to calculate context indices respectively corresponding to the next identifier codes calculated by said identifier code calculating unit, the context indices being calculated from among context indices which are identification numbers assigned on a per classification basis to the binary data classified by the identifier code and neighboring information; and
a probability variable outputting circuit having a probability variable table holding probability variables corresponding to the context indices, and configured to output probability variables respectively corresponding to the context index calculated by said context index calculating circuit,
wherein in a process cycle in which said binary data decoding circuit outputs 1-bit binary data:
said binary data decoding circuit is configured to execute the decoding by using one of the probability variables outputted by said probability variable outputting circuit;
the calculating for the next identifier codes by said identifier code calculating circuit and the calculating for the context indices by said context index calculating circuit are executed within the process cycle; and
the outputting of the probability variables respectively corresponding to the context indices is executed within the process cycle, and
a process cycle including the calculating for the next identifier codes by said identifier code calculating circuit and the calculating for the context indices by said context index calculating circuit, a process cycle for the outputting of the probability variables by said probability variable outputting circuit, and a process cycle for the decoding by said binary data decoding circuit are executed simultaneously as a three-staged pipeline.

18. An arithmetic decoding method for decoding coded data obtained by converting multivalue information of syntax into binary data and performing context-based adaptive binary arithmetic coding on the binary data, said method comprising:
decoding the coded data to output binary data;
calculating next identifier codes upon receiving input of an identifier code uniquely corresponding to a syntax element to which the binary data belongs, and;
calculating context indices respectively corresponding to the next identifier codes calculated in said calculating next identifier codes, the context indices being calculated from among context indices which are identification numbers assigned on a per classification basis to the binary data classified by the identifier code and neighboring information; and
outputting probability variables respectively corresponding to the context indices calculated in said calculating context indices, using a probability variable table holding probability variables corresponding to the context indices,
wherein, in a process cycle in which 1-bit binary data is outputted in said decoding:
the decoding is executed in said decoding by using one of the probability variables outputted in said outputting;
the calculating for the next identifier codes in said calculating next identifier codes and the calculating for the context indices in said calculating context indices are executed within the process cycle; and the outputting of the probability variables respectively corresponding to the context indices is executed within the process cycle, and a process cycle including the calculating for the next identifier codes in said calculating next identifier codes and the calculating for the context indices in said calculating context indices, a process cycle for the outputting of the probability variables in said outputting, and a process cycle for the decoding in said decoding are executed simultaneously as a three-staged pipeline.

19. An H.264/AVC Context-based Adaptive Binary Arithmetic Coding (CABAC)-based arithmetic coding apparatus which performs arithmetic coding on binary data according to Context-based Adaptive Binary Arithmetic Coding, said arithmetic coding apparatus comprising:

an identifier code sequence unit configured to set an identifier code, and to output a next identifier code upon receiving inputs of binary data to be coded and the identifier code corresponding to the binary data, the identifier code corresponding to a syntax element to which the binary data belongs and to binIdx which is information specifying a position of the binary data in a sequence of binary data making up multivalue information;

a context index calculating unit configured to calculate a context index upon receiving input of the identifier code;

a probability variable table having the calculated context index as a variable, and which outputs pStateIdx and valMPS; and an encoding unit configured to encode the binary data upon receiving inputs of the pStateIdx, the valMPS, and the binary data.

20. The arithmetic decoding apparatus according to claim 2, wherein the identifier code and the next identifier code each include binkIx which is information specifying a position of binary data in a sequence of the binary data making up the multivalue information, a current identifier code corresponding to binary data being decoded in a current process cycle is further inputted to said identifier code calculator, the next identifier codes having 2-bit information are inputted to said context index calculator, the information indicating that the binary data currently being decoded is "0" and binary data to be decoded next is "0", that the binary data currently being decoded is "0" and the binary data to be decoded next is "1", that the binary data currently being decoded is "1" and the binary data to be decoded next is "0", or that the binary data currently being decoded is "1" and the binary data to be decoded next is "1", an identifier code that immediately precedes the next identifier code and the current identifier code corresponding to the binary data currently being decoded are further inputted to said context index calculator, said identifier code calculator is configured to:

calculate first next identifier codes corresponding respectively to next-next binary data to be decoded in a next-next process cycle, when an identifier code corresponding to the binary data "0" decoded in a current process cycle and the next binary data "0" or "1" to be decoded in the next process cycle is inputted, the binary data and the next binary data being decoded by said binary data decoder;

further calculate second next identifier codes corresponding respectively to next-next binary data to be decoded in a next-next process cycle, when an identifier code corresponding to the binary data "1" decoded in a current process cycle and the next binary data "0" or "1" to be decoded in the next process cycle is inputted, the binary data and the next binary data being decoded by said binary data decoder; and select either the first next identifier codes or the second identifier codes, depending on the binary data decoded and outputted in the current process cycle by said binary data decoder, and output the selected one of the first next identifier codes and the second identifier codes, and said context index calculator is configured to:

calculate, in a current processing cycle and a next processing cycle, four types of context indices including: a context index corresponding to the next-next binary data to be decoded after-the-next when outputting (the binary data being decoded in the current process cycle, the binary data to be decoded in the next processing cycle) =(0, 0); a context index corresponding to the next-next binary data to be decoded after-the-next when outputting (0, 1); a context index corresponding to the next-next binary data to be decoded after-the-next when outputting (1, 0); and a context index corresponding to the next-next binary data to be decoded after-the-next when outputting (1, 1), and select, from among the four types of context indices, two types of context indices corresponding respectively to (0, 0) and (0, 1), or two types of context indices corresponding respectively to (1, 0) and (1, 1), depending on the binary data outputted in the current cycle by the binary data decoder, and output the selected two types of context indices.

* * * * *